US011049808B2

(12) United States Patent
Nishimura

(10) Patent No.: US 11,049,808 B2
(45) Date of Patent: Jun. 29, 2021

(54) SEMICONDUCTOR STORAGE DEVICE

(71) Applicant: Toshiba Memory Corporation, Minato-ku (JP)

(72) Inventor: Hisashi Nishimura, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 150 days.

(21) Appl. No.: 16/504,480

(22) Filed: Jul. 8, 2019

(65) Prior Publication Data

US 2020/0286822 A1  Sep. 10, 2020

(30) Foreign Application Priority Data

Mar. 6, 2019  (JP) .............................. JP2019-040734

(51) Int. Cl.
*H01L 23/528* (2006.01)
*H01L 27/11573* (2017.01)
*H01L 23/535* (2006.01)
*H01L 27/11582* (2017.01)

(52) U.S. Cl.
CPC .......... *H01L 23/528* (2013.01); *H01L 23/535* (2013.01); *H01L 27/11573* (2013.01); *H01L 27/11582* (2013.01)

(58) Field of Classification Search
CPC ................. H01L 23/528; H01L 23/535; H01L 27/11573; H01L 27/11582
See application file for complete search history.

(56) References Cited

U.S. PATENT DOCUMENTS

| 9,520,407 | B2 | 12/2016 | Fukuzumi et al. |
| 9,953,993 | B2 | 4/2018 | Utsumi et al. |
| 2015/0221667 | A1* | 8/2015 | Fukuzumi ......... H01L 29/66833 257/314 |
| 2016/0079185 | A1* | 3/2016 | Kato ................... H01L 23/5226 257/314 |
| 2018/0006049 | A1* | 1/2018 | Inomata ........... H01L 21/76805 |
| 2018/0294225 | A1 | 10/2018 | Lee et al. |

FOREIGN PATENT DOCUMENTS

JP       2015-149413       8/2015

* cited by examiner

*Primary Examiner* — Fernando L Toledo
*Assistant Examiner* — Neil R Prasad
(74) *Attorney, Agent, or Firm* — Oblon, McClelland, Maier & Neustadt, L.L.P.

(57) ABSTRACT

A semiconductor storage device of an embodiment includes: a stacked body in which a plurality of conductive layers are stacked with an insulating layer interposed therebetween, the stacked body having a memory portion in which a plurality of memory cells are disposed and a stepped portion in which ends of the plurality of conductive layers form a step shape; and a conductive portion which extends in the memory portion in a stacking direction of the stacked body inside the plurality of conductive layers from an uppermost conductive layer among the plurality of conductive layers, extends in the stepped portion in the stacking direction of the stacked body inside at least some layers among the plurality of conductive layers, and extends from the memory portion to the stepped portion in a direction intersecting the stacking direction of the stacked body. A height of the conductive portion in the stepped portion is lower than a height of the conductive portion in the memory portion.

20 Claims, 19 Drawing Sheets

SEMICONDUCTOR STORAGE DEVICE

CROSS-REFERENCE TO RELATED APPLICATIONS

This application is based upon and claims the benefit of priority from Japanese Patent Application No. 2019-040734, filed on Mar. 6, 2019; the entire contents of which are incorporated herein by reference.

FIELD

Embodiments described herein relate generally to a semiconductor storage device.

BACKGROUND

In a three-dimensional non-volatile memory, various wirings are disposed in a peripheral region of memory cells integrated at high density.

DETAILED DESCRIPTION

A semiconductor storage device of an embodiment includes: a stacked body in which a plurality of conductive layers are stacked with an insulating layer interposed therebetween, the stacked body having a memory portion in which a plurality of memory cells are disposed and a stepped portion in which ends of the plurality of conductive layers form a step shape; a plurality of pillars which are disposed in the memory portion, extend in a stacking direction of the stacked body, and form the plurality of memory cells at intersections with at least some conductive layers among the plurality of conductive layers; and a conductive portion which extends in the memory portion in the stacking direction of the stacked body inside the plurality of conductive layers from an uppermost conductive layer among the plurality of conductive layers, extends in the stepped portion in the stacking direction of the stacked body inside at least some layers among the plurality of conductive layers, and extends from the memory portion to the stepped portion in a direction intersecting the stacking direction of the stacked body. A height of the conductive portion in the stepped portion is lower than a height of the conductive portion in the memory portion.

Hereinafter, the present invention will be described in detail with reference to the drawings. Incidentally, the present invention is not limited to the following embodiment. In addition, constituent elements in the following embodiment include those that can be easily assumed by those skilled in the art or those that are substantially the same.

(Configuration Example of Semiconductor Storage Device)

Figures 1A, 1B:
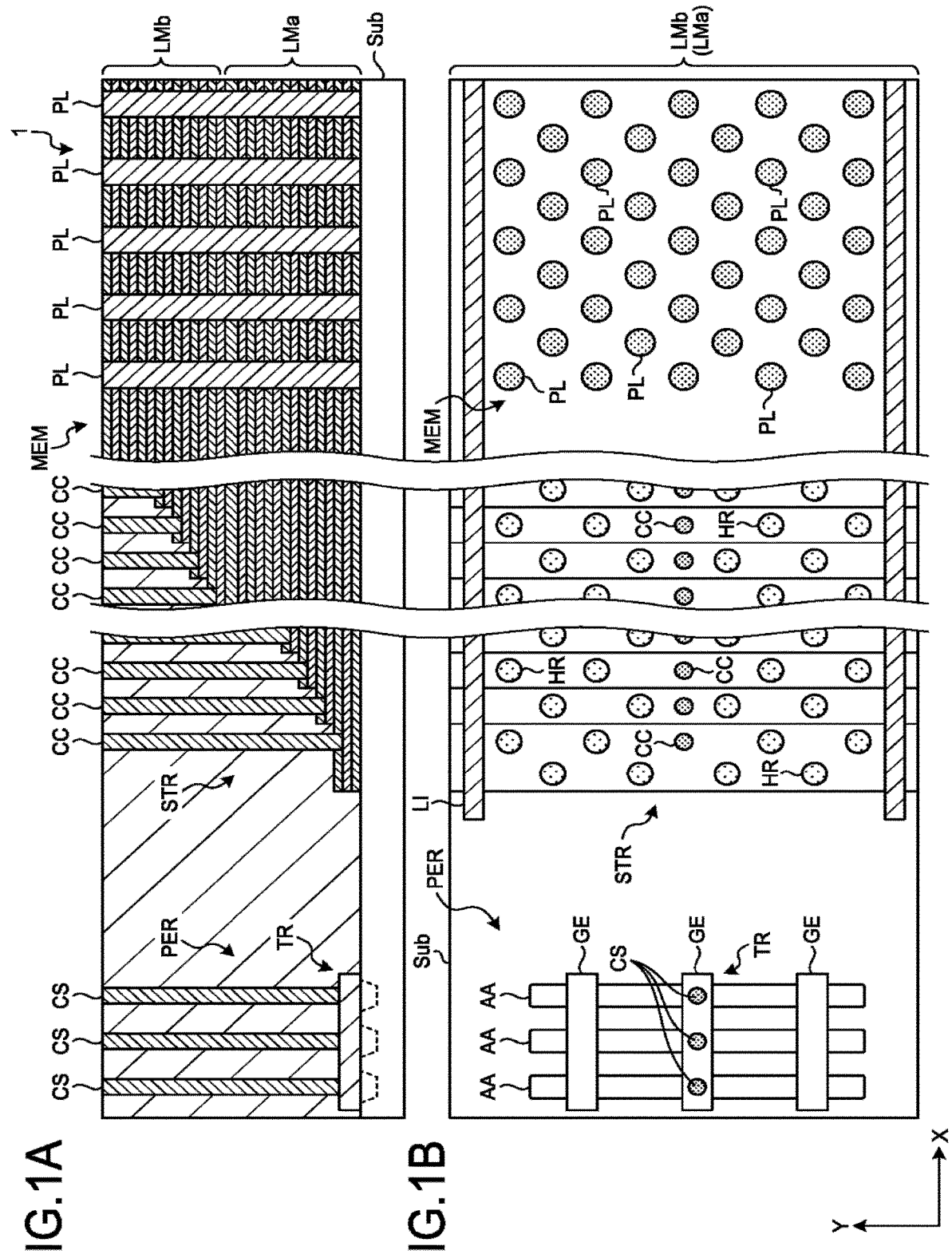
FIGS. 1A and 1B are views illustrating configuration examples of a semiconductor storage device according to an embodiment.
Figure 2A:
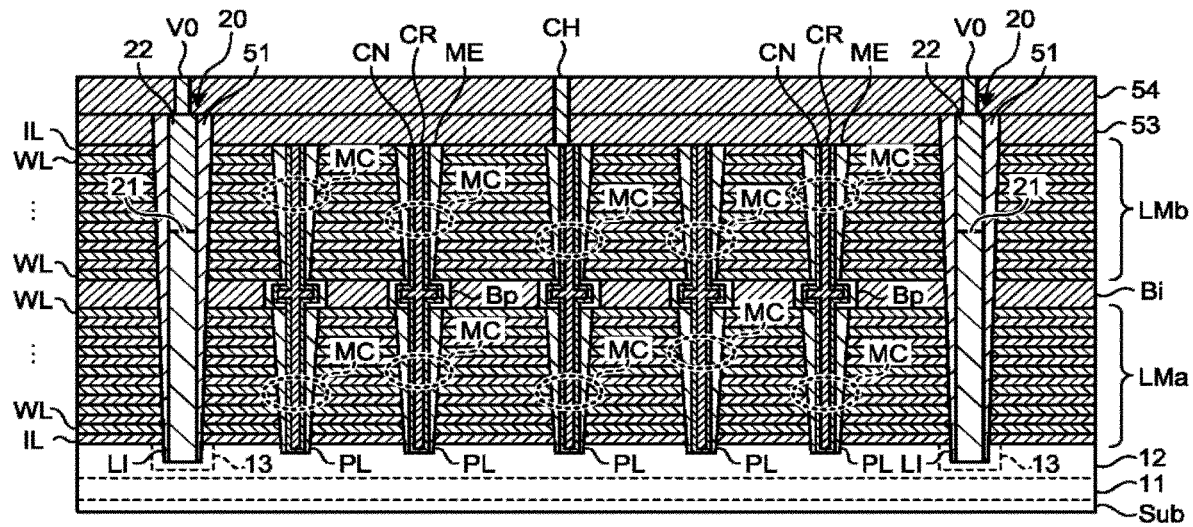
FIGS. 2A to 2C are cross-sectional views illustrating configuration examples of the semiconductor storage device according to the embodiment.
Figure 2B:
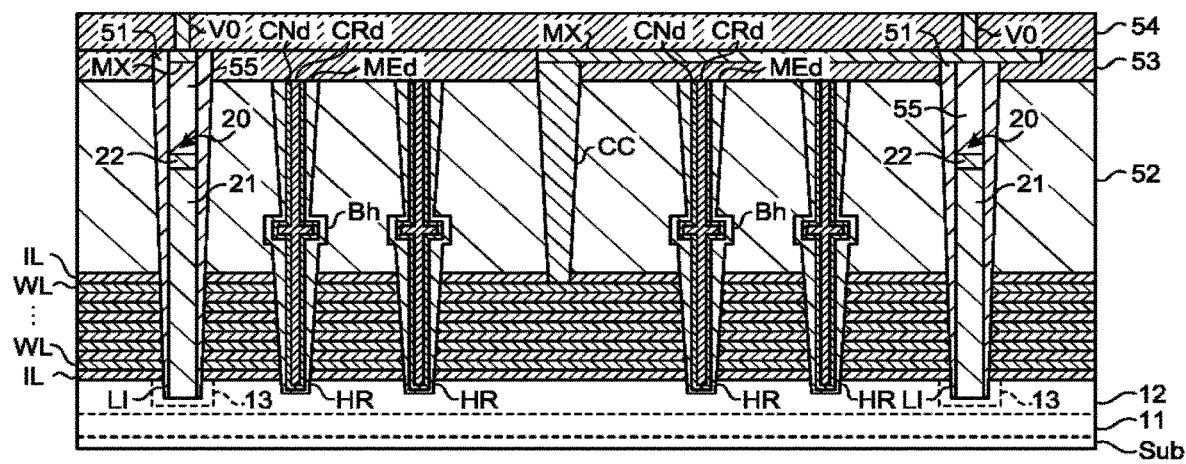
Figure 2C:
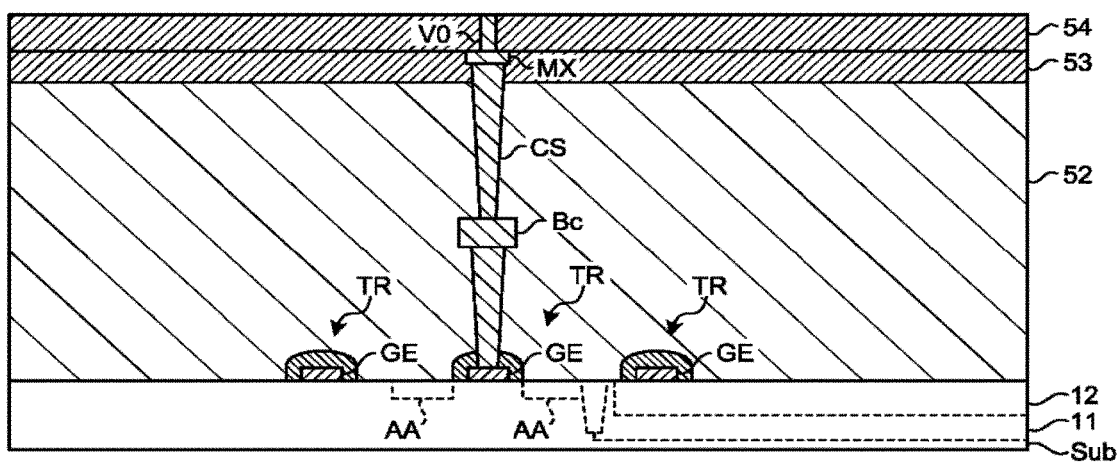

FIGS. 1A and 1B are views illustrating configuration examples of a semiconductor storage device 1 according to an embodiment; FIG. 1A is a cross-sectional view of the semiconductor storage device 1 along an X direction, and FIG. 1B is a plan view of the semiconductor storage device 1. Meanwhile, plugs CH and V0, and the like above stacked bodies LMa and LMb are not illustrated in FIGS. 1A and 1B. In addition, an insulating layer 52 and the like above a stepped portion STR and a peripheral circuit PER are not illustrated in FIG. 1B. FIGS. 2A to 2C are cross-sectional views illustrating configuration examples of the semiconductor storage device 1 according to the embodiment. In the specification, up-and-down directions are defined based on a shape of a later-described stepped portion STR. More particularly, the up direction is a direction in which a terrace portion of the stepped portion STR faces, i.e., the up direction is a direction in which an exposed surface of an insulating layer IL in each step of the stepped portion STR faces.

As illustrated in FIGS. 1A and 1B, the semiconductor storage device 1 includes the stacked bodies LMa and LMb each having a memory portion MEM and the stepped portion STR. The stacked bodies LMa and LMb are divided in a Y direction by a plurality of contacts LI that pass through the stacked bodies LMa and LMb and extend in the X direction. The peripheral circuit PER contributing to an operation of the memory portion MEM is disposed in periphery of the stacked bodies LMa and LMb in the X direction.

FIG. 2A is the cross-sectional view along the Y direction of the memory portion MEM of the semiconductor storage device 1 according to the embodiment.

As illustrated in FIGS. 1A, 1B, and 2A, the semiconductor storage device 1 includes a substrate Sub, for example, a silicon substrate or the like. The substrate Sub has an n well 11 in a surface layer portion, a p well 12 inside the n well 11, and a plurality of $n^+$ diffusion regions 13 inside the p well 12. The stacked body LMa in which a plurality of word lines WL as conductive layers and insulating layers IL are alternately stacked is disposed on the substrate Sub. The stacked body LMb in which the plurality of word lines WL as conductive layers and the insulating layers IL are alternately stacked is disposed on the stacked body LMa with a bonding layer Bi interposed therebetween. The word line WL is, for example, a tungsten layer or a molybdenum layer. The insulating layer IL and the bonding layer Bi are, for example, a $SiO_2$ layer or the like.

Incidentally, each of the stacked bodies LMa and LMb has the seven word lines WL in the example of FIG. 2A, but the number of the word lines WL is arbitrary. In addition, the stacked body LMa may be configured by disposing a select gate line (not illustrated) below the word line WL of the lowermost layer, or the stacked body LMb may be configured by disposing a select gate line (not illustrated) above the word line WL of the uppermost layer.

The plurality of contacts LI, which pass through the stacked bodies LMa and LMb and the insulating layer 53 above the stacked body LMb and divides the stacked bodies LMa and LMb in the Y direction are disposed on the $n^+$ diffusion region 13 of the substrate Sub. Each of the contacts LI has an insulating layer 51 covering a sidewall of the contact LI. An inner side of the insulating layer 51 of the contact LI is filled with a conductive layer 21 and a conductive layer 22 in this order from the bottom of the contact LI. A conductive portion 20 is constituted mainly by the conductive layer 21 and the conductive layer 22. The insulating layer 51 is, for example, a $SiO_2$ layer or the like. The conductive layer 21 is, for example, a polysilicon layer or the like, and the conductive layer 22 is made of a material different from that of the conductive layer 21, and is, for example, a tungsten layer or the like.

The contact LI in the memory portion MEM is constituted by the insulating layer 51 and the conductive portion 20 (the conductive layers 21 and 22) filling up to an upper end of the contact LI. Since the contact LI having the conductive portion 20 is disposed on the $n^+$ diffusion region 13 of the substrate Sub in this manner, the contact LI functions as a source line contact in the memory portion MEM.

A plurality of pillars PL are disposed in the stacked bodies LMa and LMb between the two contacts LI. Each of the pillars PL passes through the stacked bodies LMa and LMb and the bonding layer Bi, and are disposed in a matrix in the memory portions MEM of the stacked bodies LMa and LMb. Each of the pillars PL has a bonding portion Bp in the bonding layer Bi. Each of the pillars PL has a memory layer ME, a channel layer CN, and a core layer CR in this order from an outer circumference side of the pillar PL. The channel layer CN is also disposed at the bottom of the pillar PL. The memory layer ME is, for example, a layer in which a $SiO_2$ layer/a SiN layer/a $SiO_2$ layer are stacked, the channel layer CN is, for example, an amorphous silicon layer or a polysilicon layer, and the core layer is, for example, a $SiO_2$ layer. Since each of the pillars PL has the memory layer ME and the channel layer CN, a plurality of memory cells MC are formed at intersections between the pillars PL and the word lines WL.

In this manner, the semiconductor storage device 1 is configured as, for example, a three-dimensional non-volatile memory in which the memory cells MC are three-dimensionally disposed in the memory portion MEM.

The insulating layer 53 is disposed on the stacked body LMb. An insulating layer 54 is disposed on the insulating layer 53. The channel layer CN of each of the pillars PL is connected to an upper layer wiring such as a bit line by the plug CH passing through the insulating layers 53 and 54. The conductive portion 20 of each of the contacts LI is connected to the upper layer wiring by the plug V0 passing through the insulating layer 54.

FIG. 2B is the cross-sectional view along the Y direction of the stepped portion STR of the semiconductor storage device 1 according to the embodiment.

As illustrated in FIGS. 1A, 1B, and 2B, the stacked bodies LMa and LMb have the stepped portions STR in which the word lines WL and the insulating layers IL are formed in a step shape at ends in the X direction. When select gate lines are disposed above and below the stacked bodies LMa and LMb, the select gate lines may also be included in the stepped portion STR. Each step of the stepped portion STR is covered with the insulating layer 52 having a height equal to, for example, a height of an upper surface of the stacked body LMb of FIG. 2A. Each step of the stepped portion STR is constituted by, for example, the word line WL of one layer and the insulating layer IL of one layer which is the upper layer of the one layer of the word line WL. FIG. 2B is the cross-sectional view illustrating the fifth step from the bottom of the stacked body LMa.

The plurality of contacts LI dividing the stacked bodies LMa and LMb in the Y direction extend to the stepped portion STR. However, a height of the conductive portion 20 in the stepped portion STR is, for example, lower than a height of the conductive portion 20 in the memory portion MEM since the filling amount of the conductive layer 22 in the contact LI is small, that is, a thickness of the conductive layer 22 in the contact LI is thin. Accordingly, the conductive portion 20 in the memory portion MEM extends from the word line WL of the uppermost layer to the word lines WL of a plurality of layers disposed in the stacked bodies LMa and LMb, but the conductive portion 20 in the stepped portion STR extends in at least a part of a lower layer side of the plurality of word lines WL disposed in the stacked bodies LMa and LMb.

The contact LI in the stepped portion STR is filled with an insulating layer 55 on the conductive layer 22 inside the contact LI as much as the height of the conductive portion 20 is low. That is, the contact LI in the stepped portion STR is constituted by the insulating layer 51 filling up to the upper end of the contact LI, the conductive portion 20 (the conductive layers 21 and 22) filling to be lower than the upper end of the contact LI, and the insulating layer 55 filling on the conductive portion 20 up to the upper end of the contact LI.

A plurality of columnar portions HR are disposed in the stacked bodies LMa and LMb between the two contacts LI. The individual columnar portions HR pass through the respective steps of the stacked bodies LMa and LMb, and are disposed in a matrix in the stepped portions STR of the stacked bodies LMa and LMb. Each of the columnar portions HR has a bonding portion Bh at the same height position as the bonding layer Bi of FIG. 2A. Each of the columnar portions HR has dummy layers MEd, CNd, and CRd in this order from an outer circumference side of the columnar portion HR. The dummy layers MEd and CNd are also disposed at the bottom of the columnar portion HR. The dummy layer MEd is, for example, a layer in which a $SiO_2$ layer/a SiN layer/a $SiO_2$ layer are stacked similarly to the above-described memory layer ME. The dummy layer CNd is, for example, an amorphous silicon layer, a polysilicon layer, or the like similarly to the above-described channel layer CN. The dummy layer CRd is, for example, a $SiO_2$ layer or the like similarly to the above-described core layer CR. However, the columnar portion HR does not necessarily have the same layer structure as the pillar PL, and may have a structure filled with an insulating layer, for example, a $SiO_2$ layer, a SiN layer, or the like.

A contact CC passes through the insulating layer 52 covering the stepped portion STR and the insulating layer IL, which is the upper layer of the word line WL to be connected, to be connected to the word line WL of each step of the stepped portion STR. An upper end of the contact CC is connected to a wiring layer MX disposed in the insulating layer 53 covering the insulating layer 52. The wiring layer MX is disposed, for example, at a height position so as to have a height of at least a lower surface lower than the upper end of the contact LI in the memory portion MEM. More preferably, the wiring layer MX is disposed at a height position so as to have a height of an upper surface of the wiring layer MX substantially equal to the upper end of contact LI in the memory portion MEM.

Here, the height position of the conductive portion 20 is lower than the upper end of the contact LI itself in the contact LI in the stepped portion STR as described above. Therefore, the wiring layer MX and (the conductive portion 20 of) the contact LI are not conductive with each other. In other words, it is preferable that an upper end of the conductive portion 20 and the wiring layer MX be separated such that the insulating layer 55 disposed between the conductive portion 20 and the wiring layer MX has a layer thickness with which a withstand voltage between the conductive portion 20 and the wiring layer MX is sufficiently ensured.

Here, the height position of the wiring layer MX is compared with the above-described plug CH on the pillar PL. An upper end of the channel CN of the pillar PL to which a lower end of the plug CH is connected is positioned on a lower surface of the insulating layer 53 on which the wiring layer MX is disposed. An upper end of the plug CH is positioned, for example, on the upper surface of the insulating layer 54 which is the upper layer of the insulating layer 53. Therefore, a height of the lower end of the plug CH is lower than the height of the lower surface of the wiring layer MX, and a height of the upper end of the plug CH is higher than the height of the upper surface of the wiring layer MX.

The insulating layer 53 is disposed on the insulating layer 52 covering the stepped portion STR. An insulating layer 54 is disposed on the insulating layer 53. For example, the wiring layer MX is connected onto each of the contacts CC, and the wiring layer MX is connected to the upper layer wiring (not illustrated) by the plug V0 passing through the insulating layer 54. Incidentally, the contact LI of the stepped portion STR does not have a function as a source line contact like the contact LI of the memory portion MEM, and the contact LI of the stepped portion STR is not necessarily connected to the upper layer wiring.

FIG. 2C is the cross-sectional view along the Y direction of the peripheral circuit PER of the semiconductor storage device 1 according to the embodiment.

As illustrated in FIGS. 1A, 1B, and 2C, the peripheral circuit PER has a plurality of transistors TR. Each of the transistors TR has a gate electrode GE, and an active region AA formed on the substrate Sub on both sides of the gate electrode GE. The peripheral circuit PER including the transistor TR is covered with the insulating layer 52 having a height equal to the height of the upper surface of the stacked body LMb of FIG. 2A, for example.

A contact CS passes through the insulating layer 52 covering the peripheral circuit PER to be connected to the gate electrode GE of the transistor TR. The contact CS has a bonding portion Bc at the same height position as the bonding layer Bi of FIG. 2A. An upper end of the contact CS is connected to the wiring layer MX disposed in the insulating layer 53 covering the insulating layer 52. The wiring layer MX is disposed at a height substantially equal to that of the wiring layer MX of the stepped portion STR. Incidentally, a contact (not illustrated) may pass through the insulating layer 52 to be connected even to the active region AA of the transistor TR.

The insulating layer 53 is disposed on the insulating layer 52 covering the peripheral circuit PER. An insulating layer 54 is disposed on the insulating layer 53. For example, the wiring layer MX is connected onto the contact CS, and the wiring layer MX is connected to the upper layer wiring (not illustrated) by the plug V0 passing through the insulating layer 54 and further connected to, for example, the plug V0 and the wiring layer MX disposed above the stepped portion STR. Since the contact CS and the wiring layers MX are connected in this manner, the wiring layer MX disposed above the stepped portion STR is also electrically connected to the peripheral circuit PER that contributes to the operation of the memory cell MC.

(Example of Process of Manufacturing Semiconductor Storage Device)

Next, an example of a process of manufacturing the semiconductor storage device 1 according to the embodiment will be described with reference to FIGS. 3A to 19C. FIGS. 3A to 19C are flow diagrams illustrating examples of a procedure of the process of manufacturing the semiconductor storage device 1 according to the embodiment. A, B and C in the same drawing number indicate different sites in the same processing step. A of FIGS. 3A to 19A correspond to the site of FIG. 2A, B of FIGS. 3B to 19B correspond to the site of FIG. 2B, and C of FIGS. 3C to 19C correspond to the site of FIG. 2C.

Figure 3A:
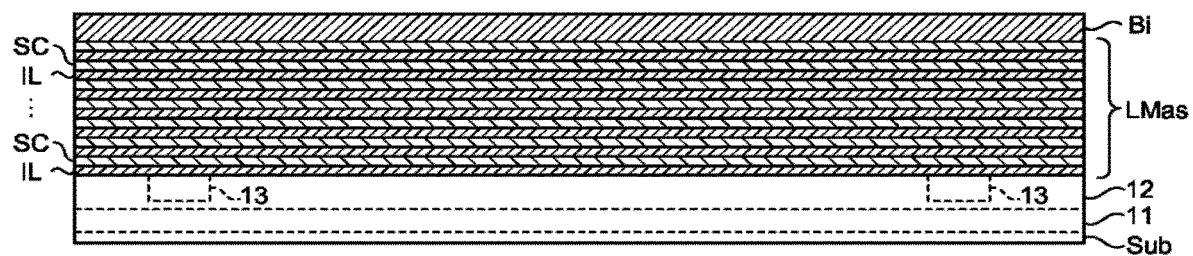
FIGS. 3A to 3C are flow diagrams illustrating examples of a procedure of a process of manufacturing the semiconductor storage device according to the embodiment.
Figure 3B:
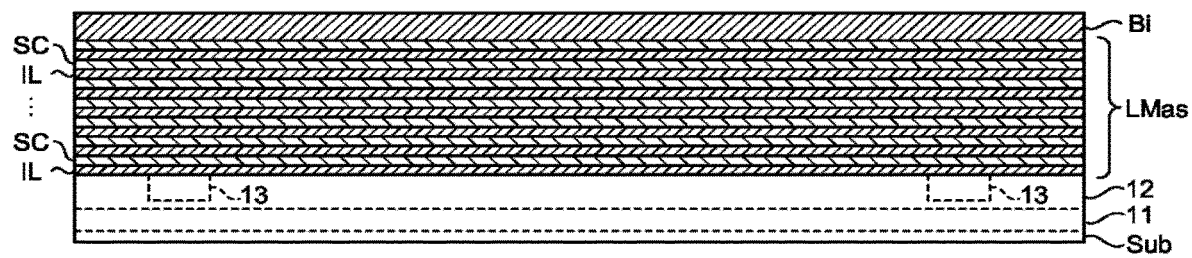
Figure 3C:
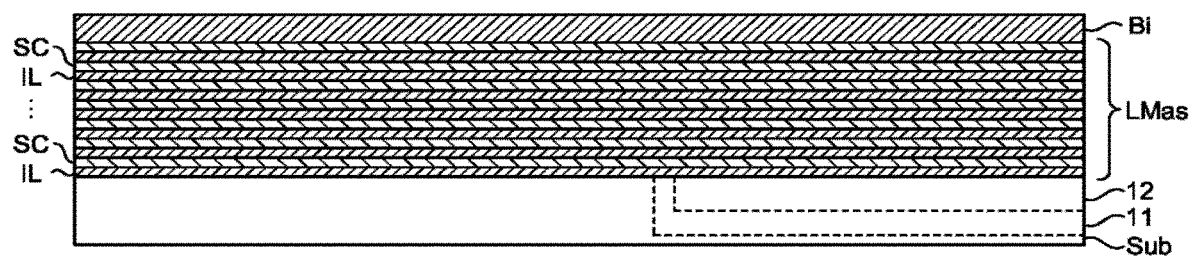

As illustrated in FIGS. 3A to 3C, a stacked body LMas in which a plurality of sacrificial layers SC and insulating layers IL are alternately stacked is formed on the substrate Sub on which the n well 11, the p well 12, the plurality of $n^+$ diffusion regions 13, and the like are formed in the surface layer portion. The sacrificial layer SC is an insulating layer such as a SiN layer, for example, and is a layer that is to be replaced with a conductive material later to form the word line WL. The bonding layer Bi is formed on the stacked body LMas.

Figure 4A:
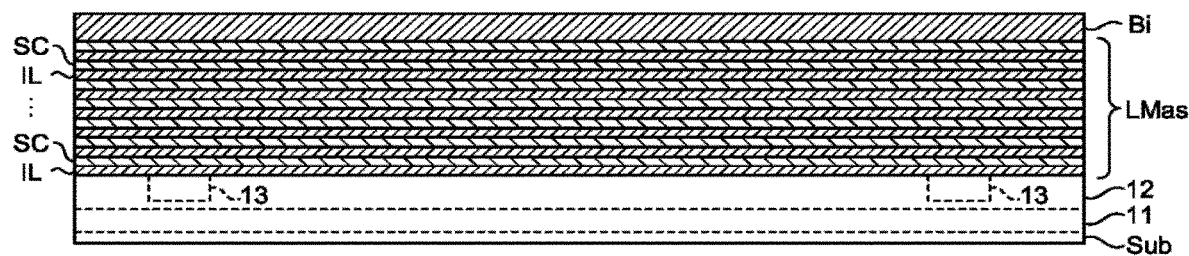
FIGS. 4A to 4C are flow diagrams illustrating examples of the procedure of the process of manufacturing the semiconductor storage device according to the embodiment.
Figure 4B:
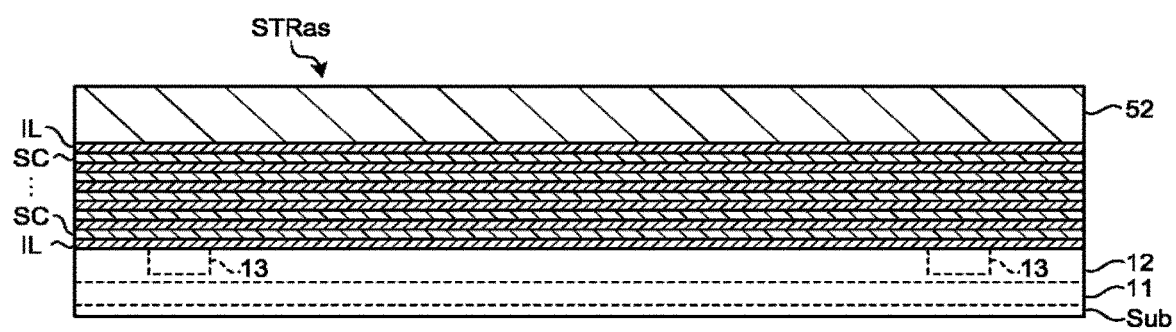

As illustrated in FIG. 4B, a stepped portion STRas is formed in the stacked body LMas. In this example, the stacked body LMas has, for example, the seven sacrificial layers SC, so that the stepped portion STRas of the stacked body LMas has seven steps. FIG. 4B is a cross-sectional view illustrating the fifth step from the bottom of the stacked body LMas similarly to FIG. 2B. Here, the insulating layer IL on the sixth layer from the lowermost layer constituting the fifth step is set as an uppermost surface, and the sacrificial layer SC and the insulating layer IL on upper layers of the uppermost surface are removed. The entire stepped portion STRas is covered with the insulating layer 52 up to a height of the bonding layer Bi on the stacked body LMas.

Figure 4C:
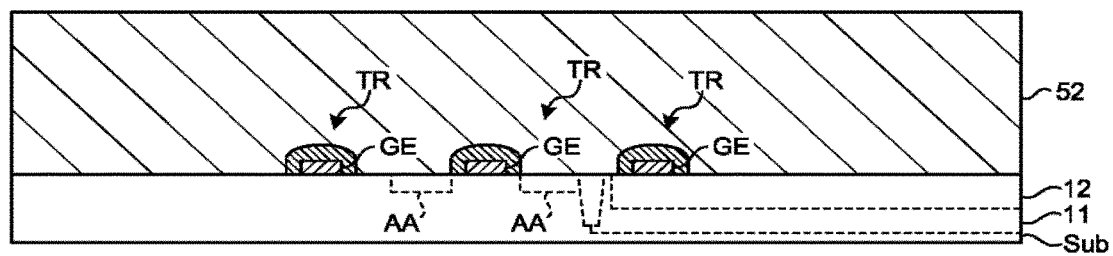

As illustrated in FIG. 4C, in a region where the peripheral circuit PER is to be formed, the stacked body LMas is completely removed from the top of the substrate Sub, and the transistor TR including the active region AA and the gate electrode GE and the like are formed at the substrate Sub. The entire transistor TR is covered with the insulating layer 52 up to the height of the bonding layer Bi on the stacked body LMas.

Figure 5A:
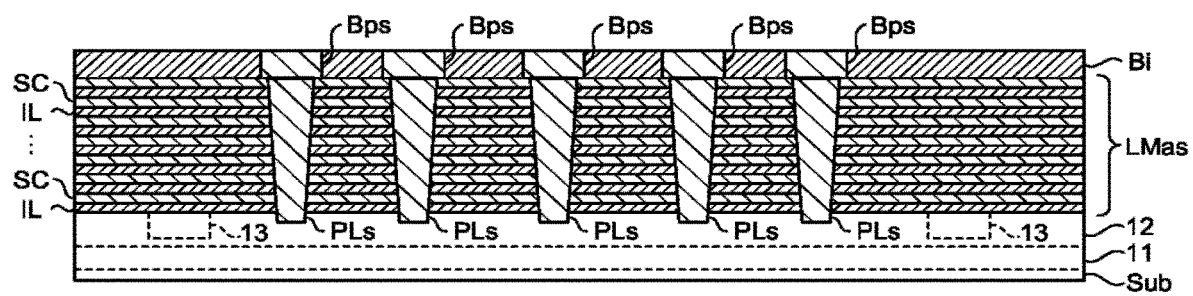
FIGS. 5A to 5C are flow diagrams illustrating examples of the procedure of the process of manufacturing the semiconductor storage device according to the embodiment.

As illustrated in FIG. 5A, a pillar PLs in which a lower layer structure of the pillar PL is filled with a sacrificial layer is formed in the stacked body LMas. That is, a memory hole passing through the stacked body LMas and the bonding layer Bi is formed, and an inner side of the memory hole is filled with the sacrificial layer such as an amorphous silicon layer. As a result, the pillar PLs having a bonding portion Bps at an upper end thereof is formed.

Figure 5B:
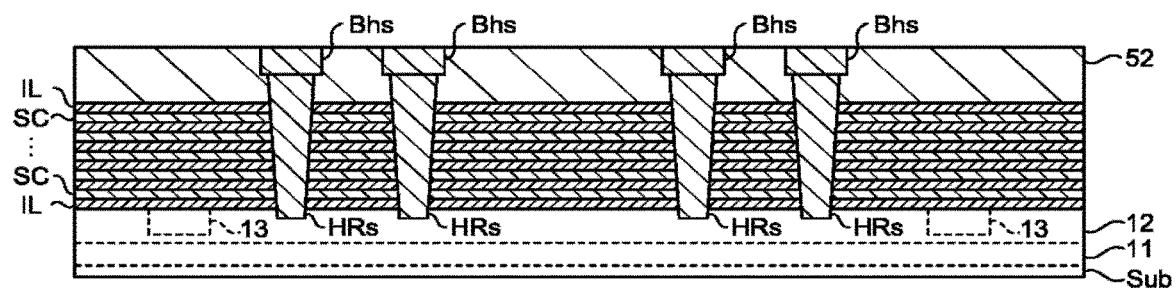

As illustrated in FIG. 5B, a columnar portion HRs in which a lower layer structure of the columnar portion HR is filled with a sacrificial layer is formed in each step of the stepped portion STR. That is, a hole passing through the insulating layer 52 above the stepped portion STR and each step of the stepped portion STR is formed, and an inner side of the hole is filled with the sacrificial layer such as an amorphous silicon layer. As a result, the columnar portion HRs having a bonding portion Bhs at an upper end thereof is formed.

Figure 5C:
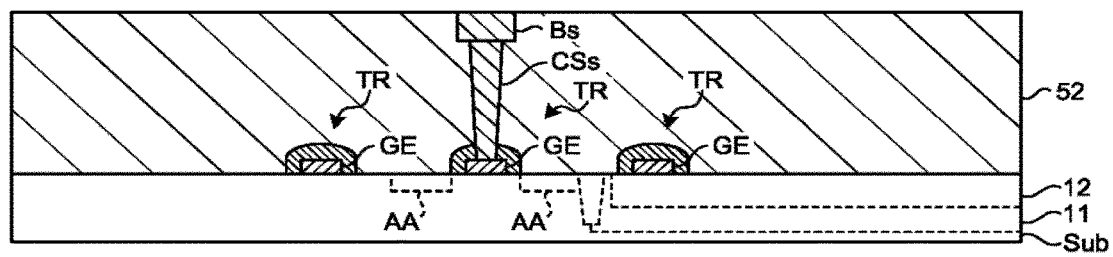

As illustrated in FIG. 5C, a contact CSs and a bonding portion Bcs in which a lower layer structure of the contact CS is filled with a sacrificial layer are formed on the gate electrode GE of the transistor TR. That is, a contact hole passing through the insulating layer 52 above the transistor TR up to an upper surface of the gate electrode GE is formed, and the contact hole is filled with the sacrificial layer such as an amorphous silicon layer. The sacrificial layer such as the amorphous silicon layer is a layer that is to be replaced with a conductive material later to form the contact CS and the bonding portion Bc.

Figure 6A:
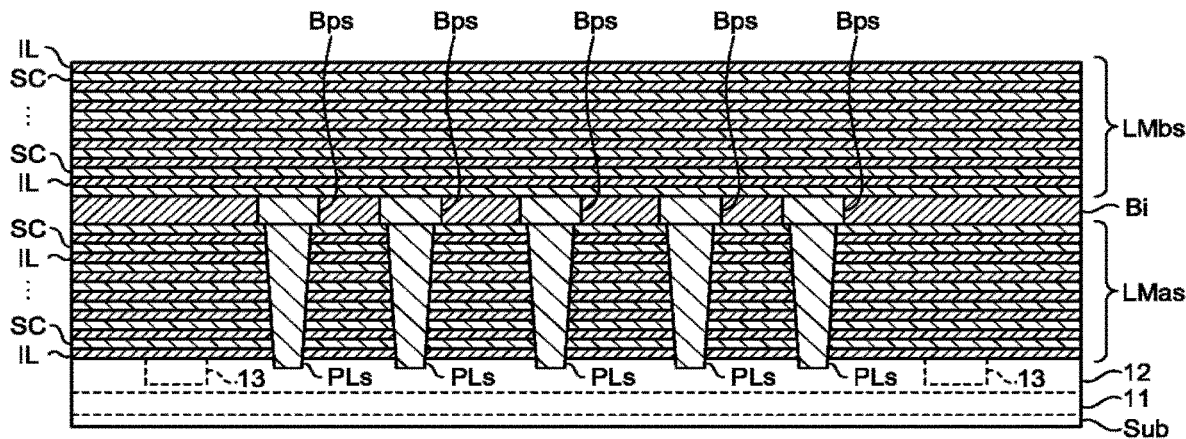
FIGS. 6A to 6C are flow diagrams illustrating examples of the procedure of the process of manufacturing the semiconductor storage device according to the embodiment.
Figure 6B:
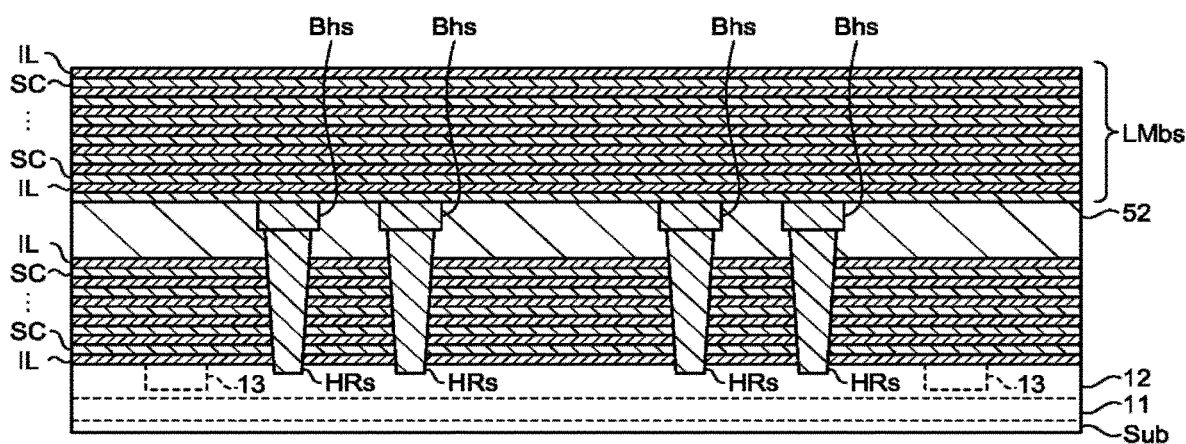
Figure 6C:
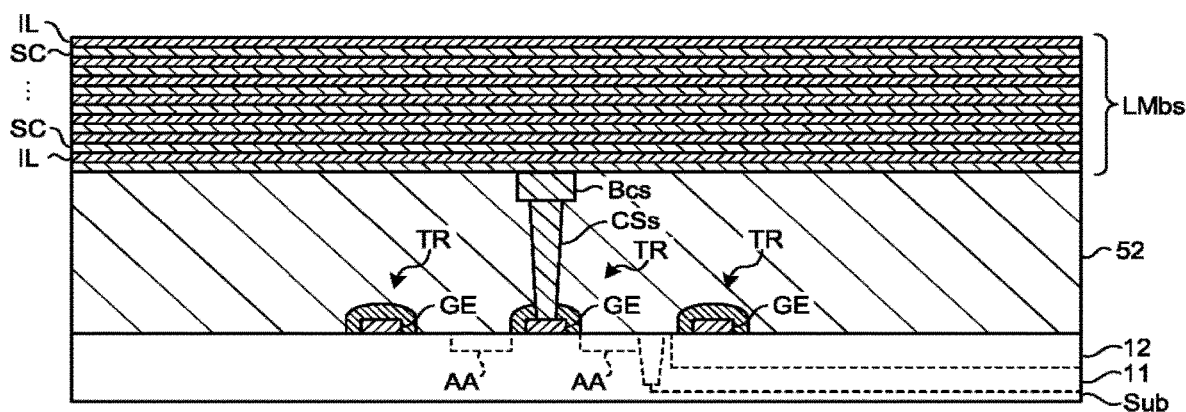

As illustrated in FIGS. 6A to 6C, a stacked body LMbs in which a plurality of sacrificial layers SC and insulating layers IL are alternately stacked is formed in an upper layer of each portion. That is, the stacked body LMbs is formed on the stacked body LMas with the bonding layer Bi interposed therebetween in the site illustrated in FIG. 6A. In the site illustrated in FIG. 6B, the stacked body LMbs is formed to cover the stepped portion STRas with the insulating layer 52 interposed therebetween. In the site illustrated in FIG. 6C, the stacked body LMbs is formed to cover the transistor TR with the insulating layer 52 interposed therebetween.

Figure 7A:
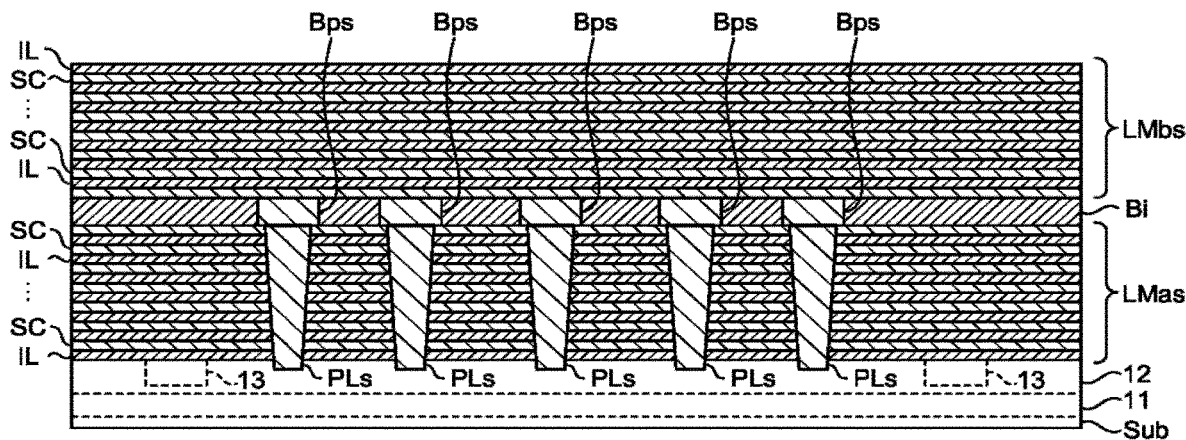
FIGS. 7A to 7C are flow diagrams illustrating examples of the procedure of the process of manufacturing the semiconductor storage device according to the embodiment.
Figure 7B:
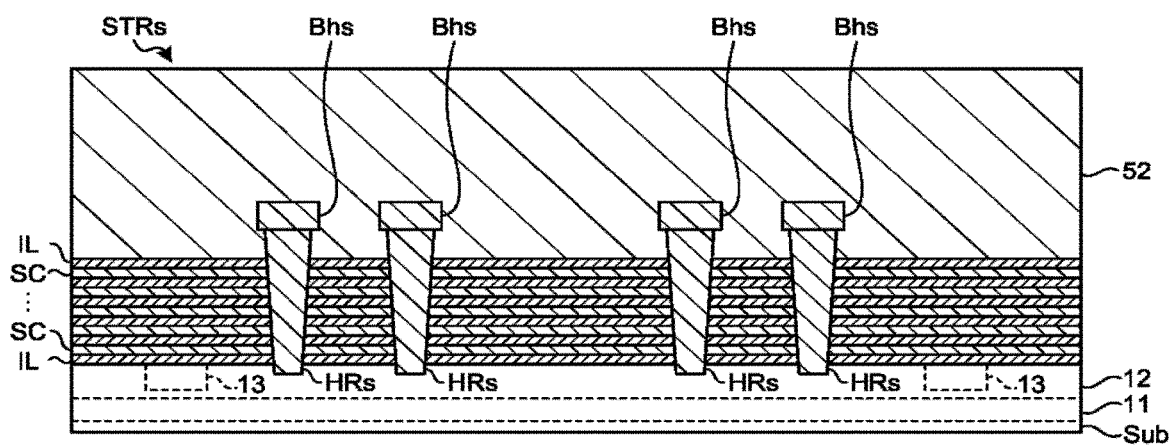

As illustrated in FIG. 7B, a stepped portion of an upper layer is formed in the stacked body LMbs. In this example, the stacked body LMbs has, for example, the seven sacrificial layers SC, so that the stepped portion of the stacked body LMbs has seven steps. As a result, a stepped portion STRs having a plurality of steps is formed in each of the stacked bodies LMas and LMbs. The entire stepped portion STRs is covered with the insulating layer 52 to the same height as the uppermost layer of the stacked body LMbs.

Figure 7C:
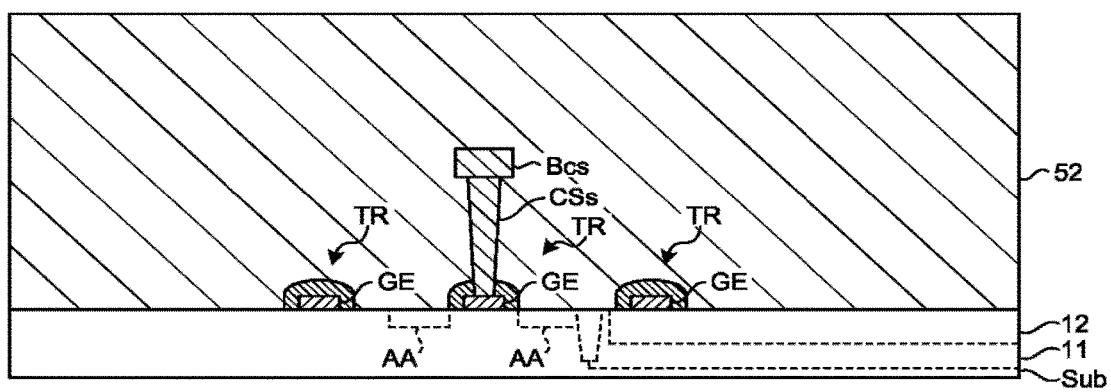

As illustrated in FIG. 7C, the stacked body LMbs is completely removed from above the insulating layer 52 in a region where the peripheral circuit PER has been formed, and then, the removed portion is backfilled with the insulating layer 52. As a result, the entire transistor TR is covered with the insulating layer 52 to the same height as the uppermost layer of the stacked body LMbs.

Figure 8A:
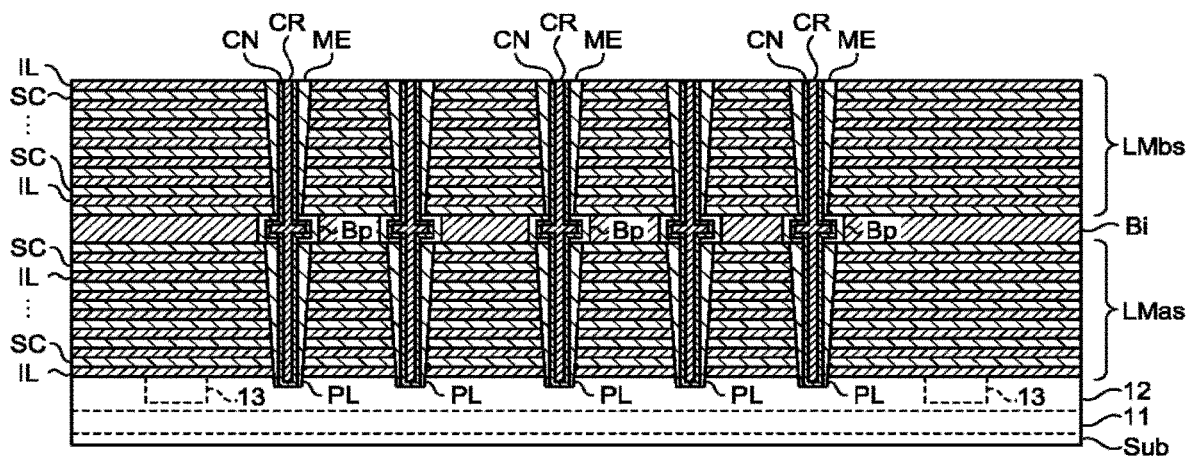
FIGS. 8A to 8C are flow diagrams illustrating examples of the procedure of the process of manufacturing the semiconductor storage device according to the embodiment.

As illustrated in FIG. 8A, the pillars PL are formed in the stacked bodies LMas and LMbs. That is, a memory hole passing through the stacked body LMbs and reaching the bonding portion Bps at the upper end of the pillar PLs is formed, and the sacrificial layer of the pillar PLs is removed through the memory hole. The memory layer ME such as the $SiO_2$ layer/the SiN layer/the $SiO_2$ layer, the channel layer CN such as the amorphous silicon layer or the polysilicon layer, and the core layer CR such as the $SiO_2$ layer are formed in this order from an inner wall side of the memory hole which is open through the stacked bodies LMas and LMbs. The channel layer CN is also formed at the bottom of the memory hole. As a result, the pillar PL having the bonding portion Bp at the central portion thereof is formed.

Figure 8B:
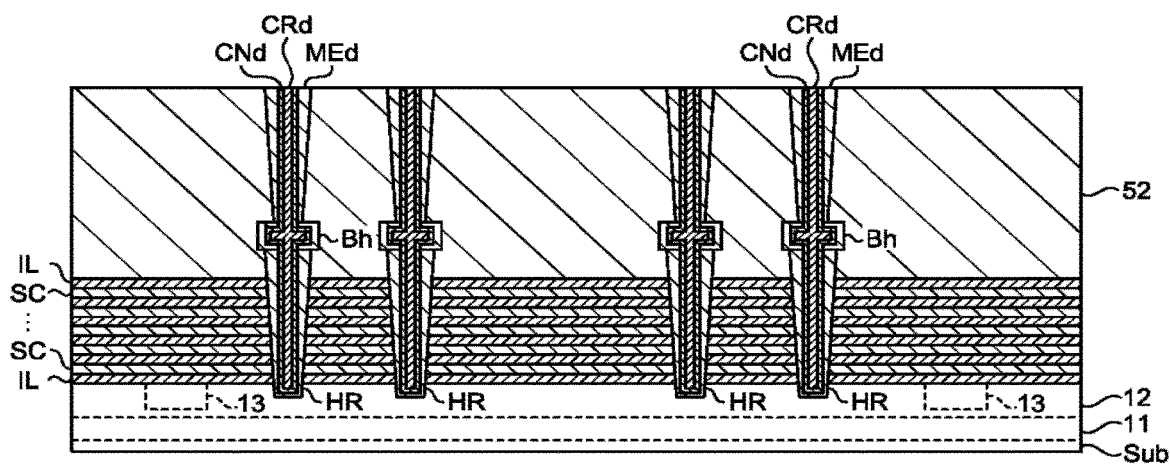
Figure 8C:
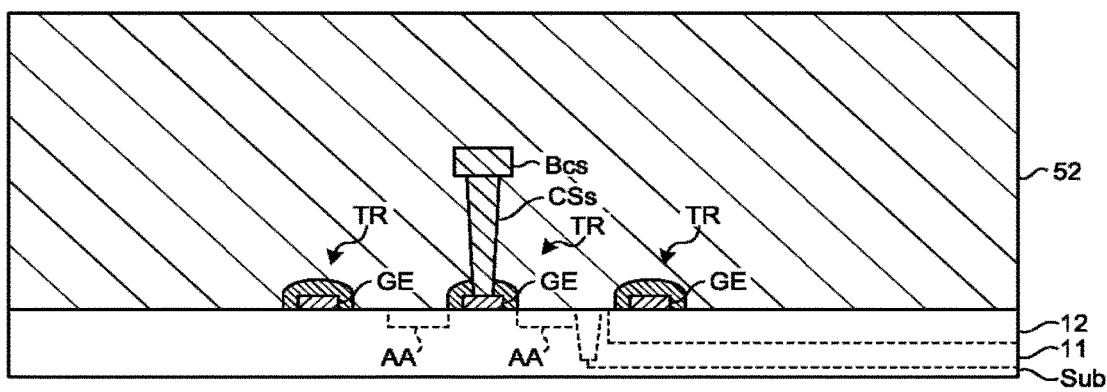

As illustrated in FIG. 8B, the columnar portion HR is formed at each step of the stepped portion STR. That is, a hole passing through the insulating layer 52 above the stepped portion STR and reaching the bonding portion Bhs at the upper end of the columnar portion HRs is formed, and the sacrificial layer of the columnar portion HRs is removed through the hole. The dummy layer MEd such as the $SiO_2$ layer/the SiN layer/the $SiO_2$ layer, the dummy layer CNd such as the amorphous silicon layer or the polysilicon layer, and the dummy layer CRd such as the $SiO_2$ layer are formed in this order from an inner wall side of the hole which is open through the respective steps of the stepped portion STR. The dummy layers MEd and CNd are also formed at the bottom of the hole. As a result, the columnar portion HR having the bonding portion Bh at the central portion thereof is formed.

Incidentally, the example in which the pillars PL and the columnar portions HR are formed in parallel has been described in FIGS. 5A to 8C, but the pillars PL and the columnar portions HR may be separately formed. In addition, the pillars PL and the columnar portions HR may be made of different materials.

Figure 9A:
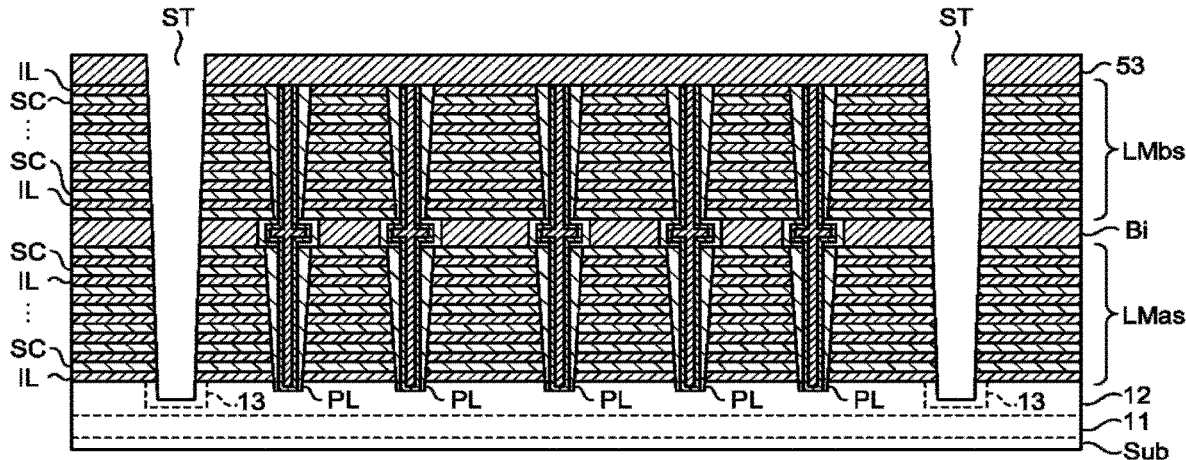
FIGS. 9A to 9C are flow diagrams illustrating examples of the procedure of the process of manufacturing the semiconductor storage device according to the embodiment.
Figure 9B:
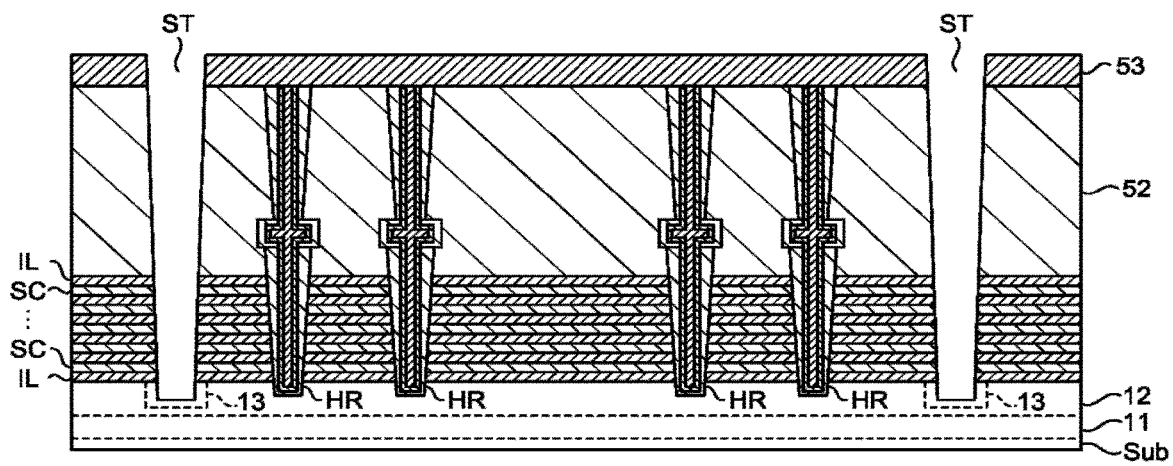
Figure 9C:
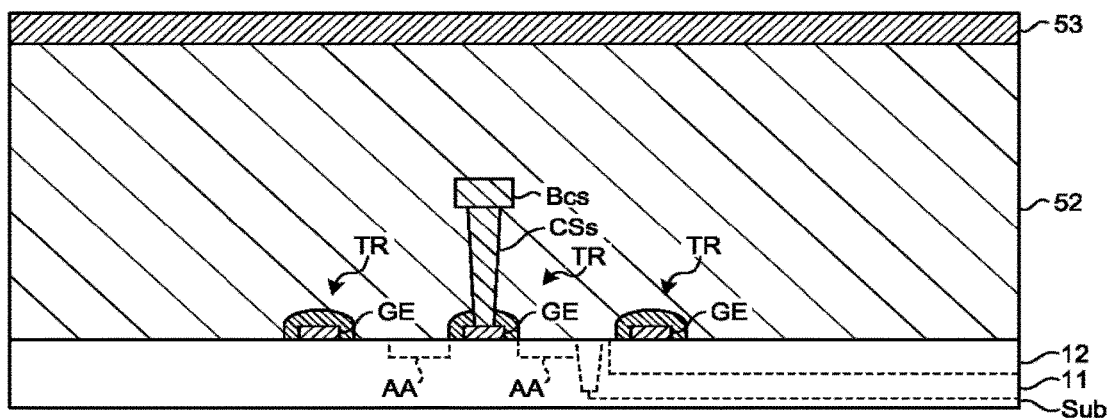

As illustrated in FIGS. 9A to 9C, the insulating layer 53 is formed at an upper layer of each portion. That is, the insulating layer 53 is formed on stacked body LMbs in the site illustrated to FIG. 9A. In the sites illustrated in FIGS. 9B and 9C, the insulating layer 53 is formed on the insulating layer 52.

As illustrated in FIGS. 9A and 9B, slits ST reaching the n$^+$ diffusion region 13 at a surface layer of the substrate Sub are formed. That is, in the site illustrated in FIG. 9A, the slit ST is formed to pass through the insulating layer 53, the stacked body LMbs, the bonding layer Bi, and the stacked body LMas. In the site illustrated in FIG. 9B, the slit ST is formed to pass through the insulating layers 53 and 52 and the respective steps of the stepped portion STRs. As illustrated in FIG. 9C, the slit ST is not formed, for example, in the vicinity of the transistor TR.

Figure 10A:
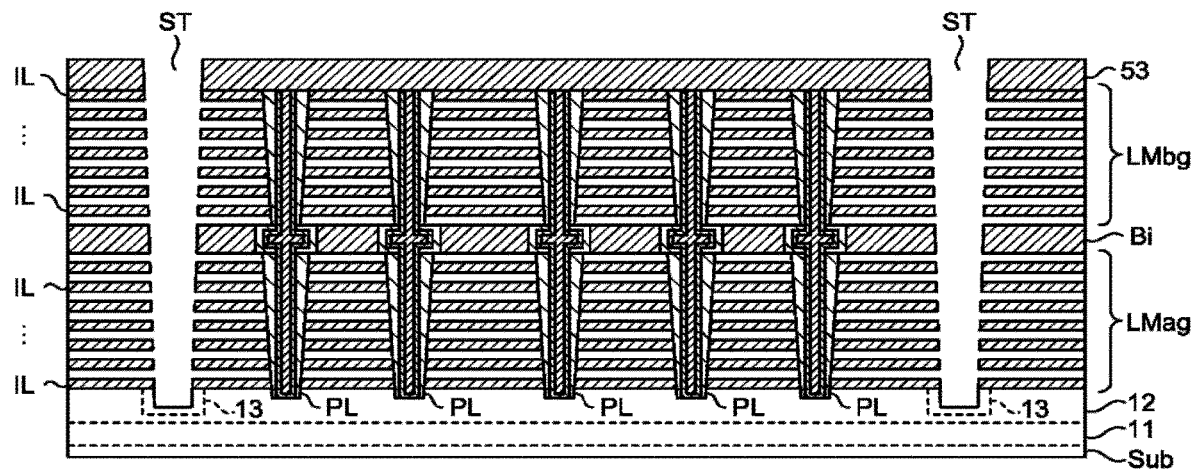
FIGS. 10A to 10C are flow diagrams illustrating examples of the procedure of the process of manufacturing the semiconductor storage device according to the embodiment.
Figure 10B:
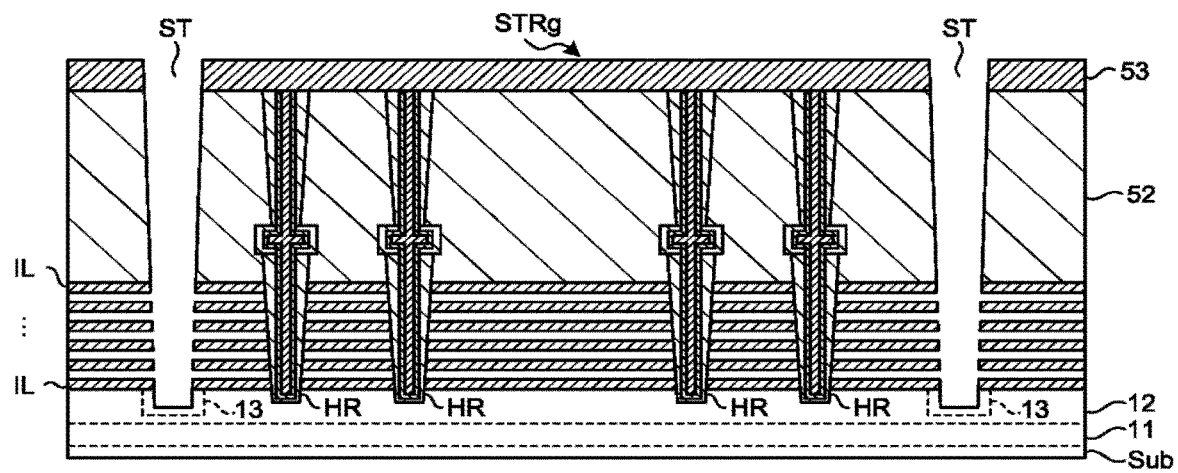
Figure 10C:
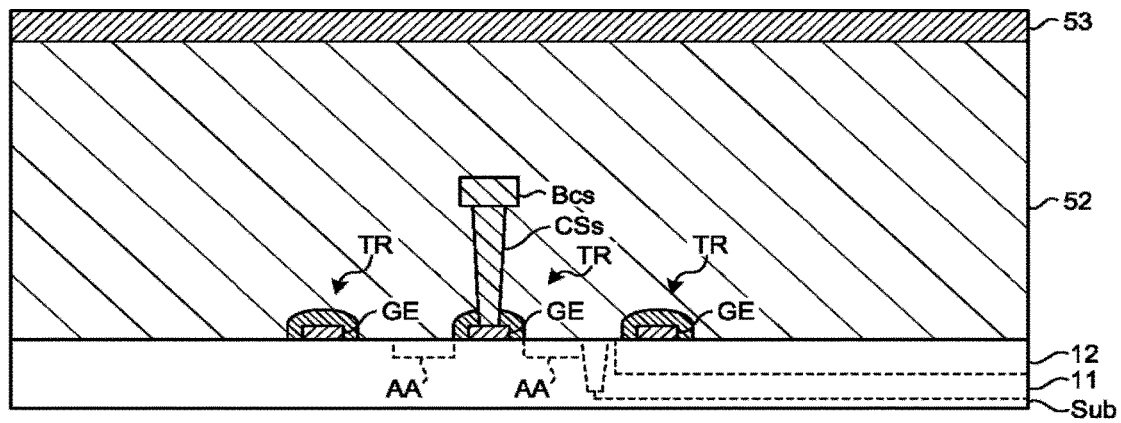

As illustrated in FIGS. 10A and 10B, the sacrificial layer SC in the stacked bodies LMas and LMbs is removed through the slit ST passing through the stacked bodies LMas and LMbs. As a result, stacked bodies LMag and LMbg in which gaps are formed between the respective insulating layers IL are formed. The stacked bodies LMag and LMbg are fragile structures including the plurality of gaps. At this time, the columnar portion HR disposed in the stepped portion STRg serves a role of a post to suppress collapses of the stacked bodies LMag and LMbg.

Figure 11A:
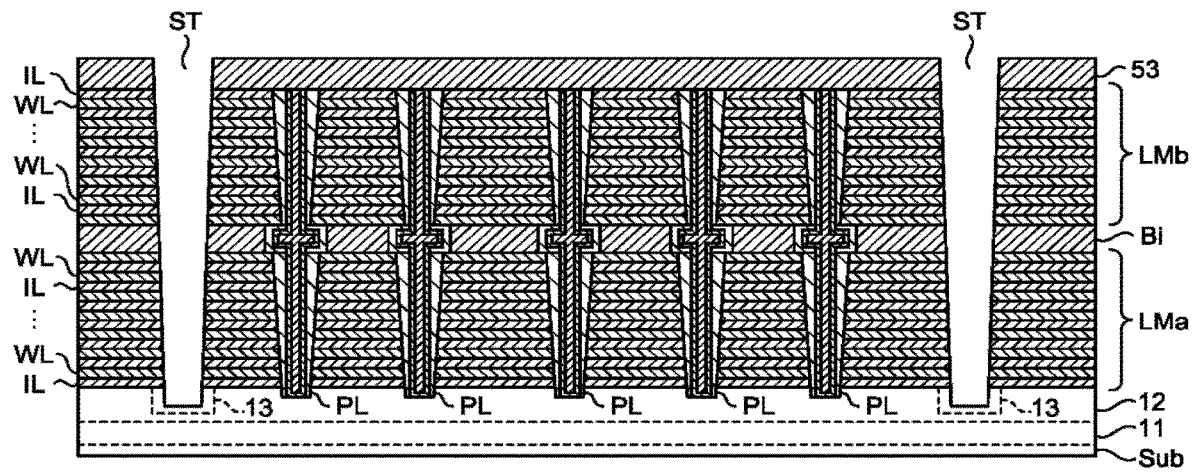
FIGS. 11A to 11C are flow diagrams illustrating examples of the procedure of the process of manufacturing the semiconductor storage device according to the embodiment.
Figure 11B:
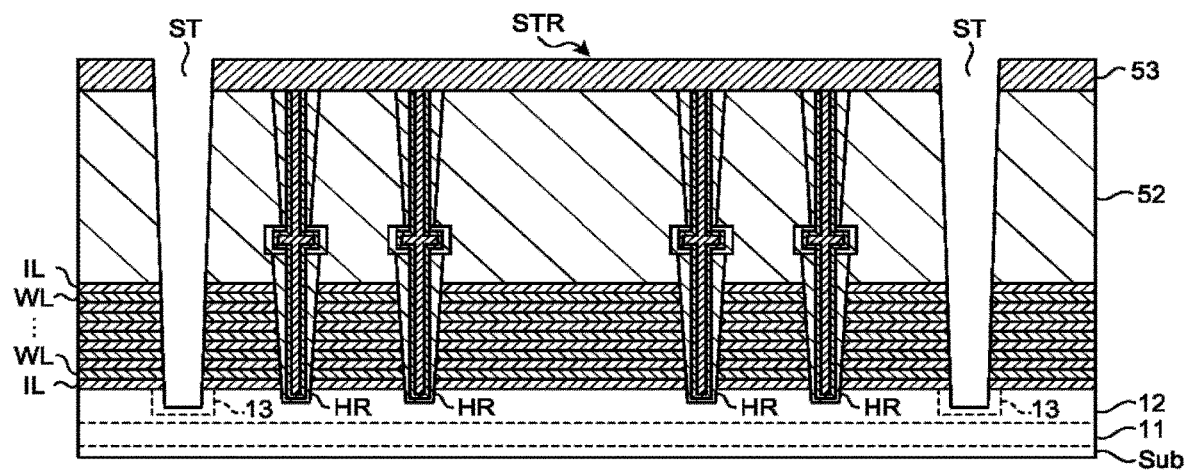
Figure 11C:
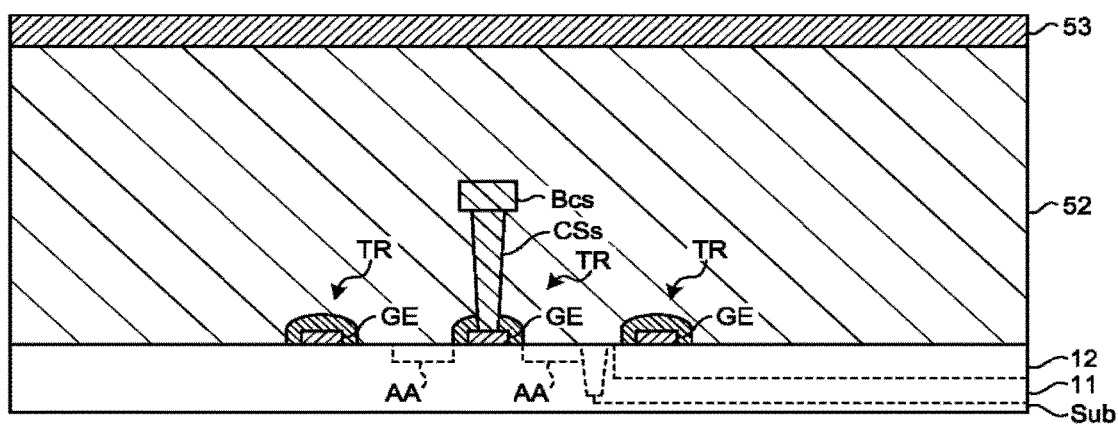

As illustrated in FIGS. 11A and 11B, the gap in the stacked bodies LMag and LMbg is filled with a conductive material through the slit ST passing through the stacked bodies LMag and LMbg. As a result, the stacked bodies LMa and LMb in which the word lines WL are formed between the respective insulating layers IL are formed.

Figure 12A:
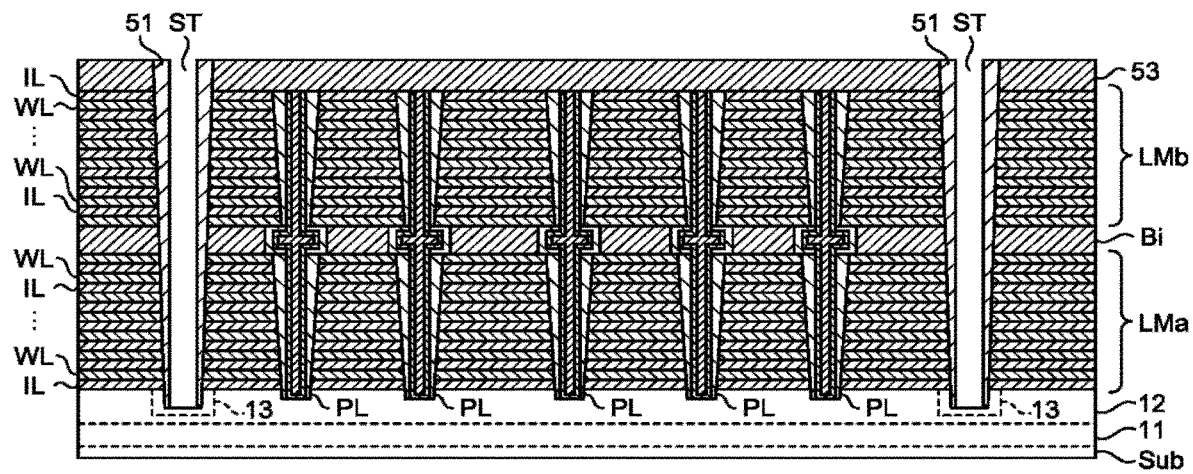
FIGS. 12A to 12C are flow diagrams illustrating examples of the procedure of the process of manufacturing the semiconductor storage device according to the embodiment.
Figure 12B:
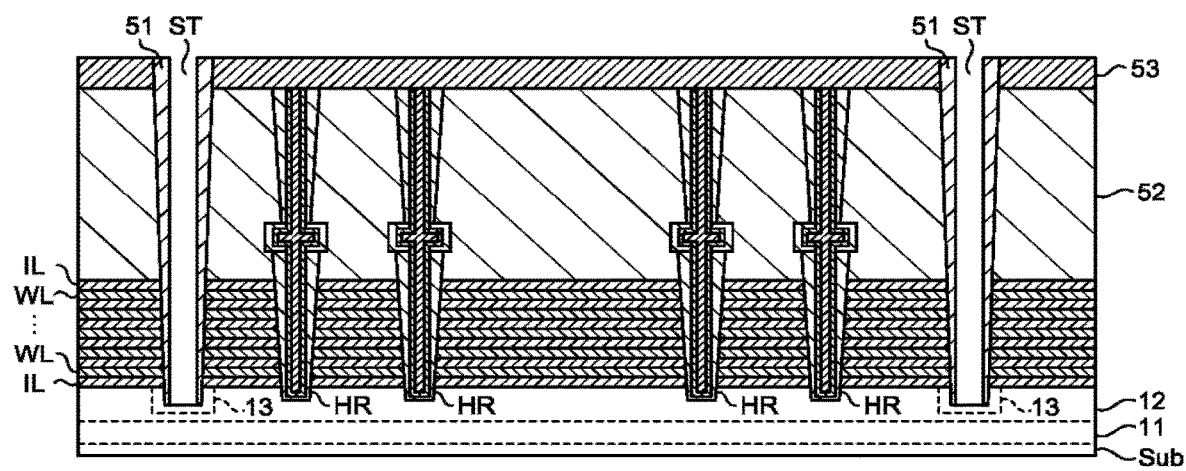
Figure 12C:
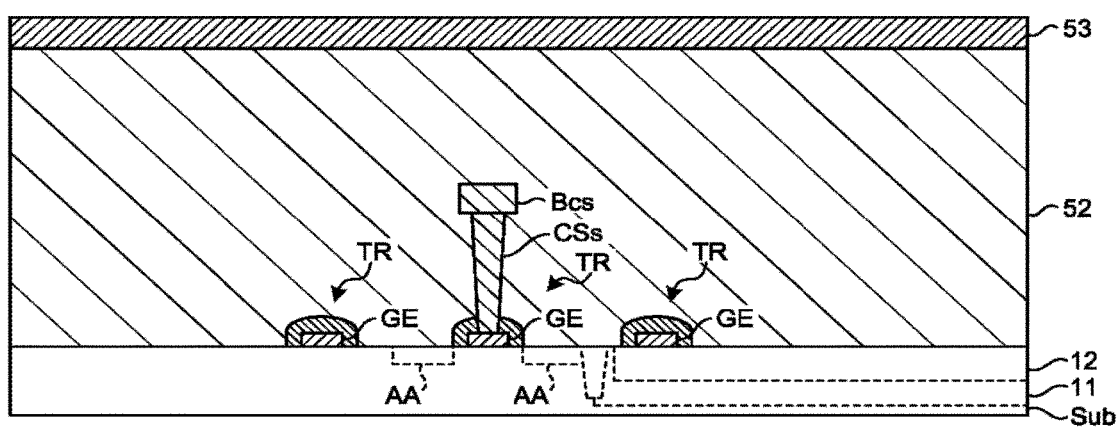

As illustrated in FIGS. 12A and 12B, the insulating layer 51 is formed on an inner wall of the slit ST.

Figure 13A:
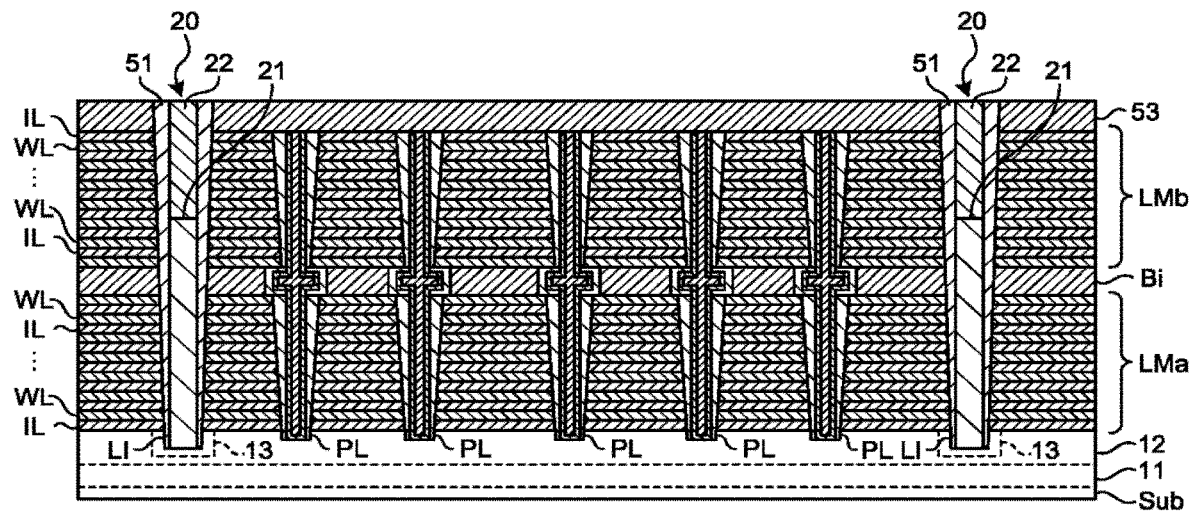
FIGS. 13A to 13C are flow diagrams illustrating examples of the procedure of the process of manufacturing the semiconductor storage device according to the embodiment.
Figure 13B:
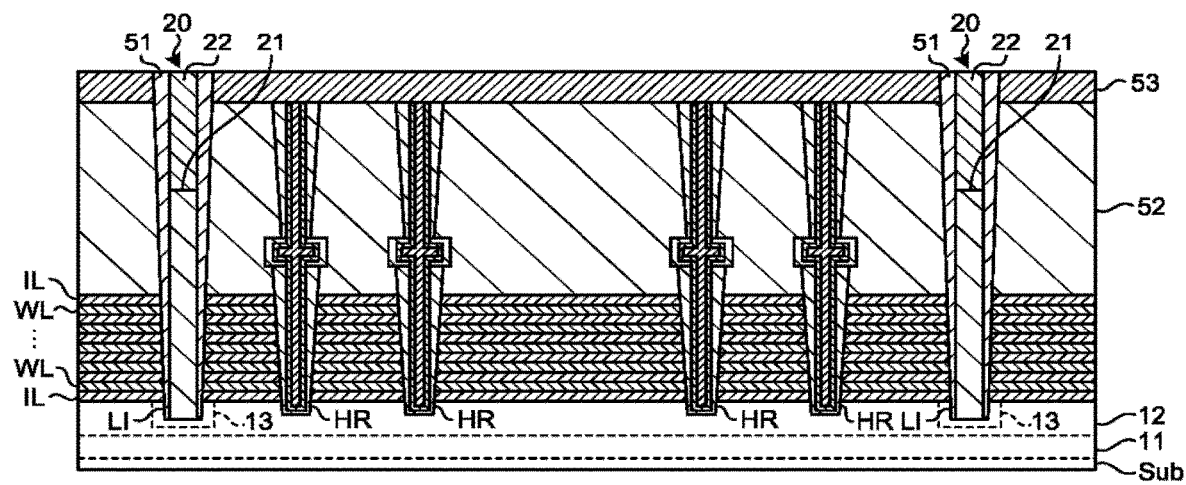
Figure 13C:
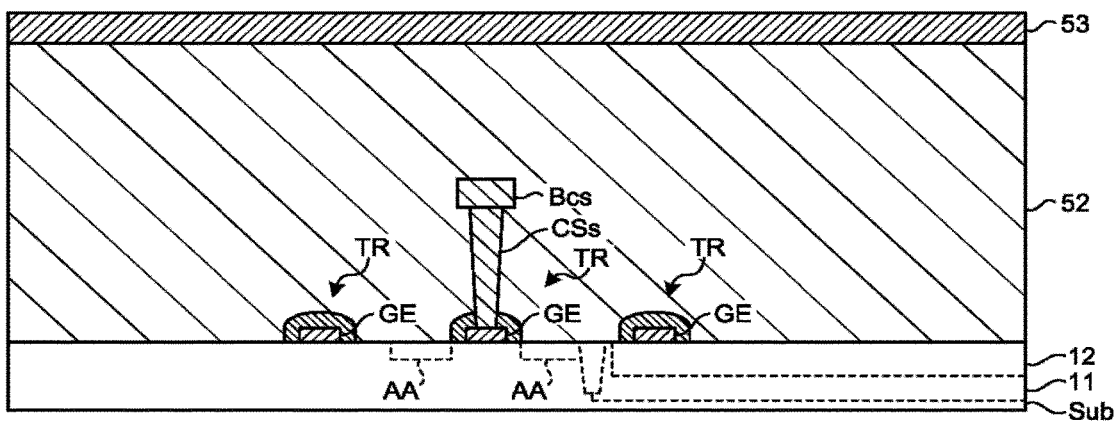

As illustrated in FIGS. 13A and 13B, a more inner side of the insulating layer 51 of the slit ST is filled with the conductive layer 21 such as the polysilicon layer from the bottom of the slit ST up to, for example, a height exceeding the bonding layer Bi between the stacked bodies LMa and LMb. In addition, the conductive layer 22 such as the tungsten layer is formed on the conductive layer 21 in the slit ST, for example, up to the height of the upper surface of the insulating layer 53. As a result, the contact LI having the conductive portion 20 including the conductive layers 21 and 22 formed therein is formed.

Figure 14A:
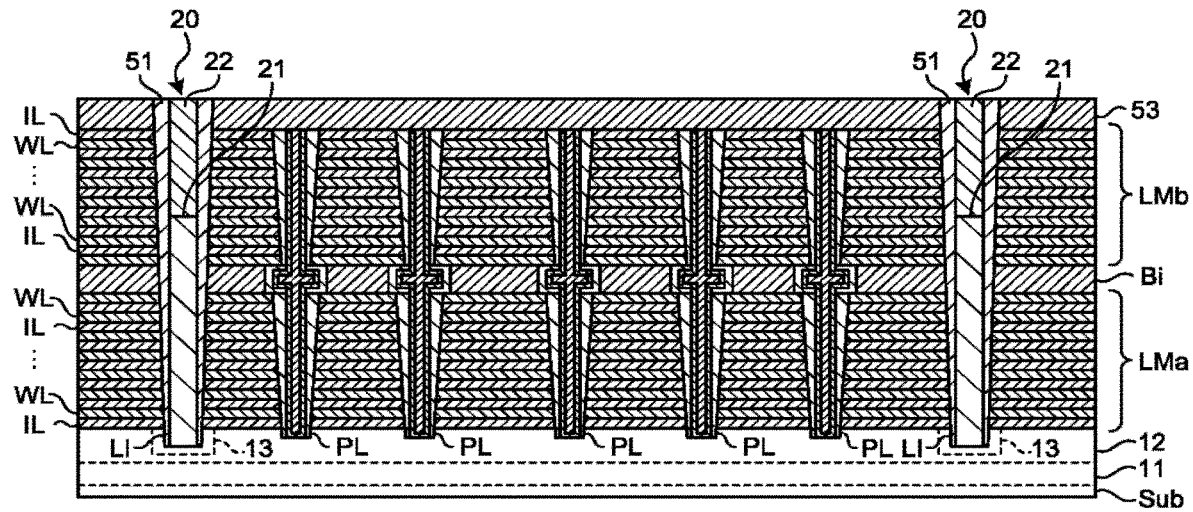
FIGS. 14A to 14C are flow diagrams illustrating examples of the procedure of the process of manufacturing the semiconductor storage device according to the embodiment.
Figure 14B:
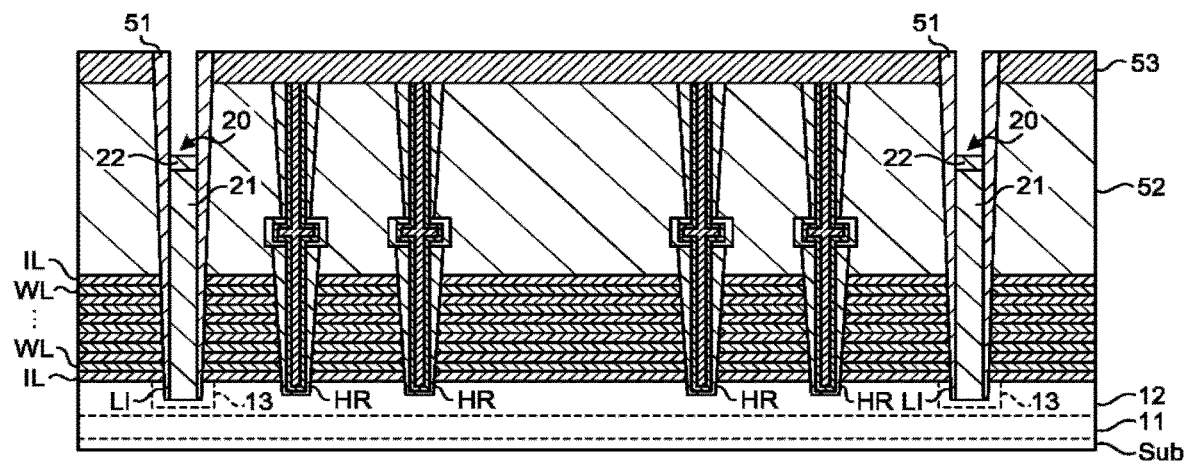
Figure 14C:
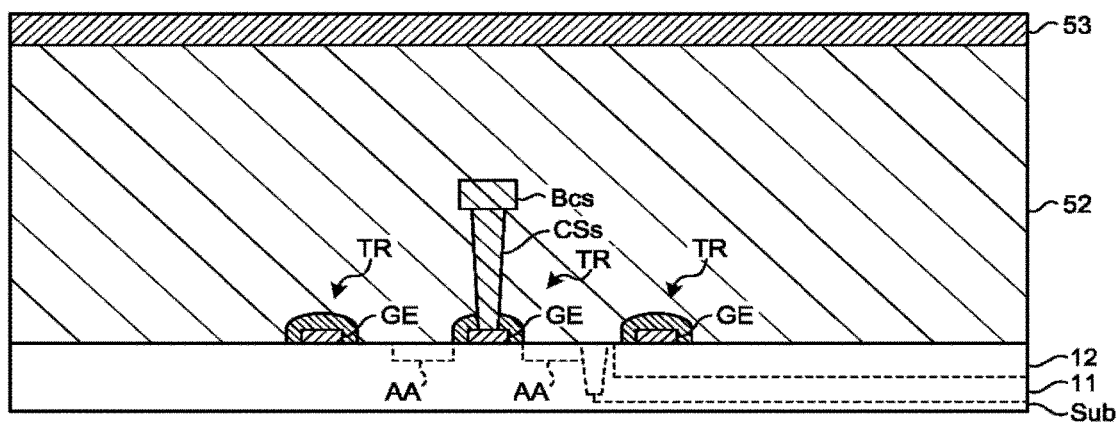

As illustrated in FIG. 14B, the conductive layer 22 inside the contact LI disposed in the stepped portion STR is partially or entirely removed. As a result, the height of the conductive portion 20 in the stepped portion STR becomes lower than the height of at least the conductive portion 20 in the memory portion MEM. The height of the conductive portion 20 in the stepped portion STR is preferably adjusted to such that the upper end of the conductive portion 20 is separated from the wiring layer MX to such an extent that the withstand voltage with the wiring layer MX, which is to be formed later with the height of the insulating layer 53, can be sufficiently ensured.

Figure 15A:
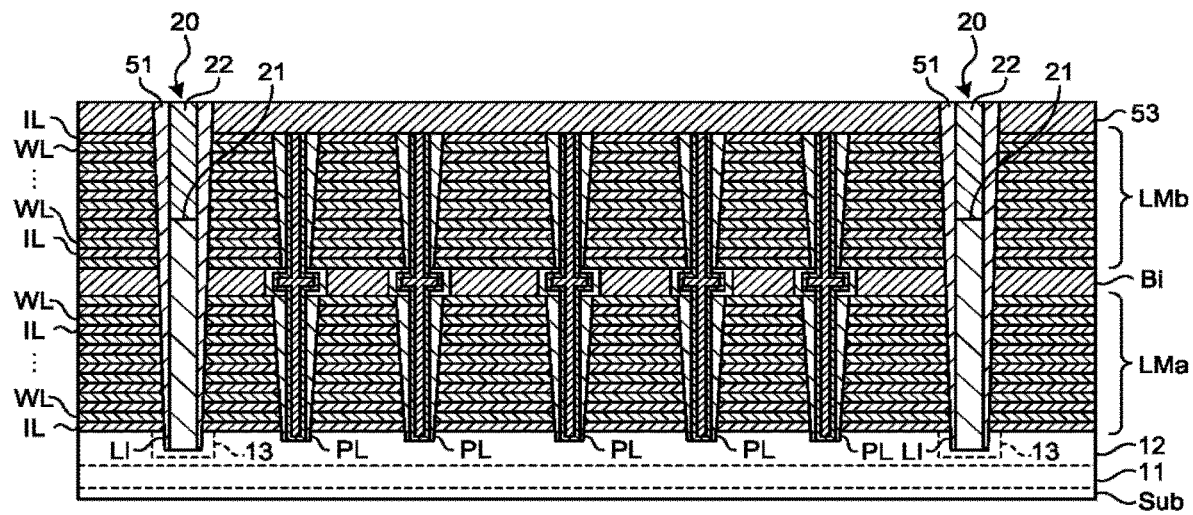
FIGS. 15A to 15C are flow diagrams illustrating examples of the procedure of the process of manufacturing the semiconductor storage device according to the embodiment.
Figure 15B:
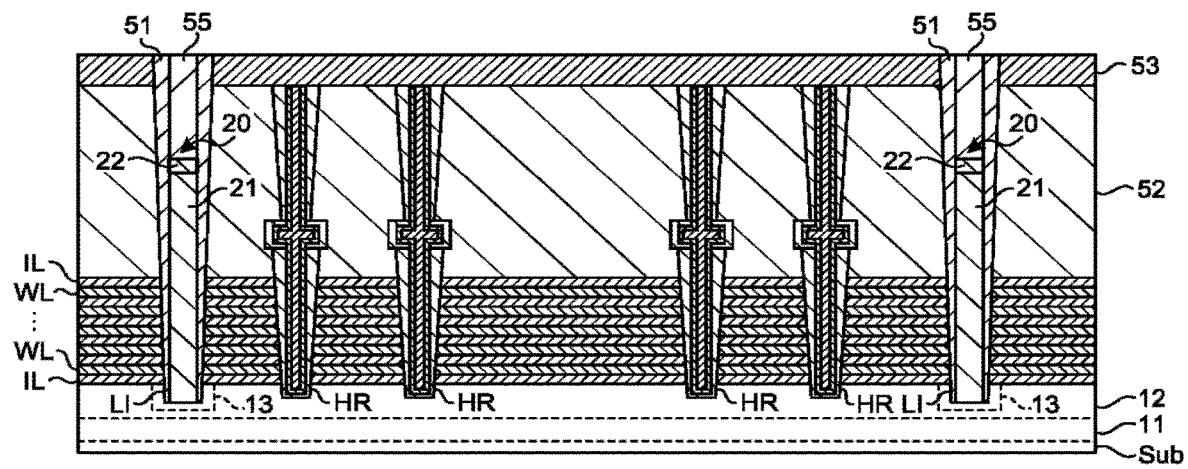
Figure 15C:
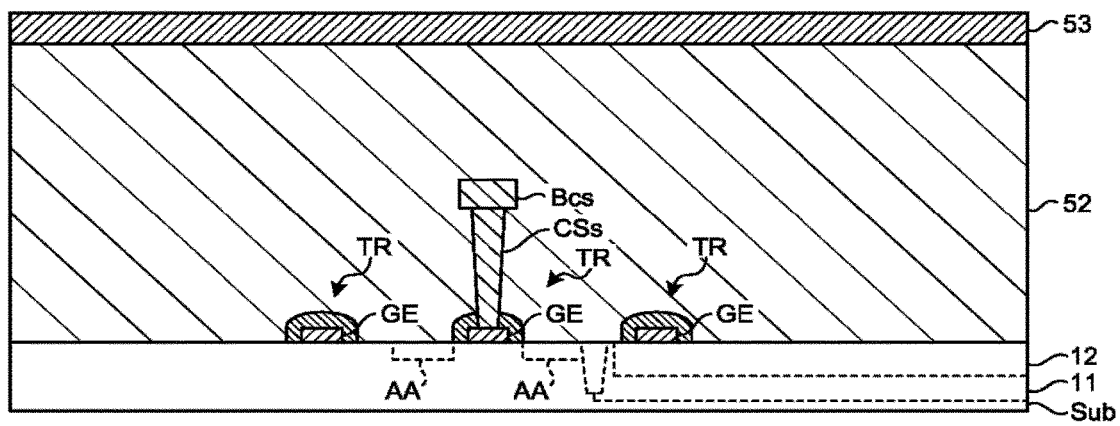

As illustrated in FIG. 15B, the insulating layer 55 back-fills the inside of the contact LI disposed in the stepped portion STR. More specifically, a gap inside the contact LI is filled with the insulating layer 55, and the insulating layer 55 is also formed on the insulating layer 53. Thereafter, the insulating layer 55 is polished, for example, up to the upper end of the contact LI by chemical mechanical polishing (CMP) or the like.

With a process to be illustrated as follows, the contact CC of the stepped portion STR and the wiring layer MX connected thereto, and the contact CS on the transistor TR and the wiring layer MX connected thereto can be formed by, for example, a dual damascene method.

Figure 16A:
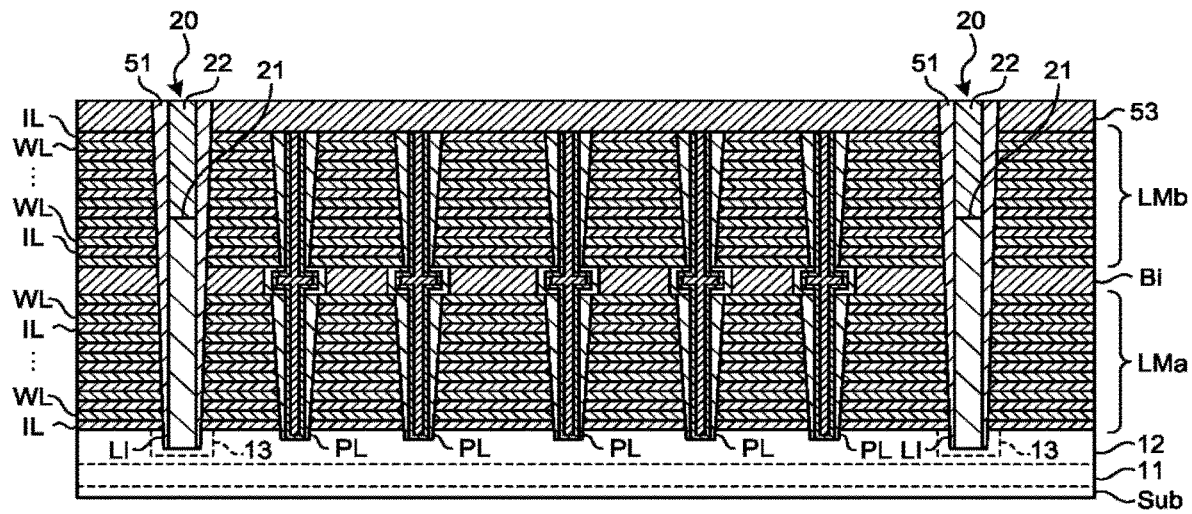
FIGS. 16A to 16C are flow diagrams illustrating examples of the procedure of the process of manufacturing the semiconductor storage device according to the embodiment.
Figure 16B:
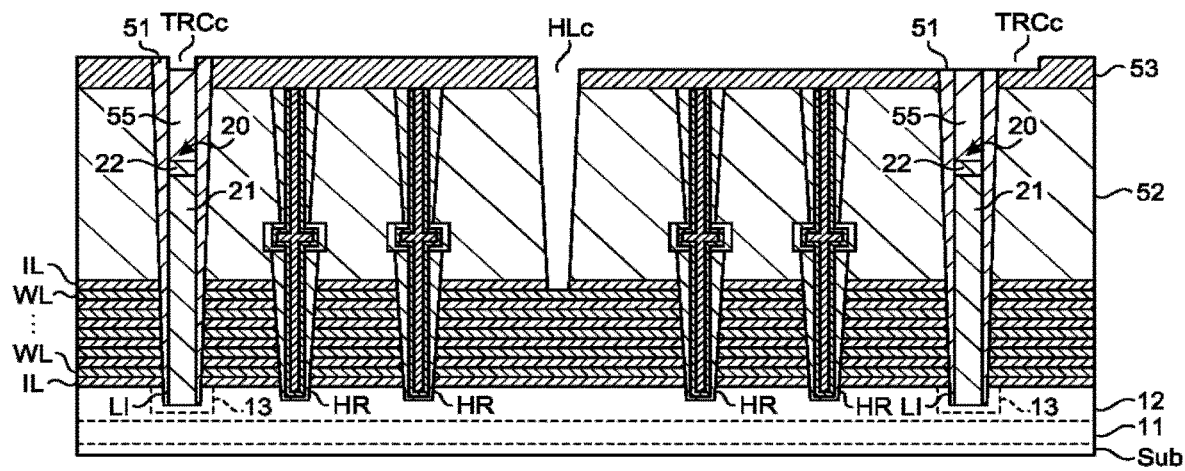

As illustrated in FIG. 16B, a contact hole HLc, which passes through the insulating layers 53 and 52 on the stepped portion STR and reaches the word line WL at each step of the stepped portion STR, and a trench TRCc connected to an upper end of the contact hole HLc are formed. The trench TRCc extends up to, for example, the top of the contact LI, and partially overlaps the conductive portion 20 of the contact LI.

Figure 16C:
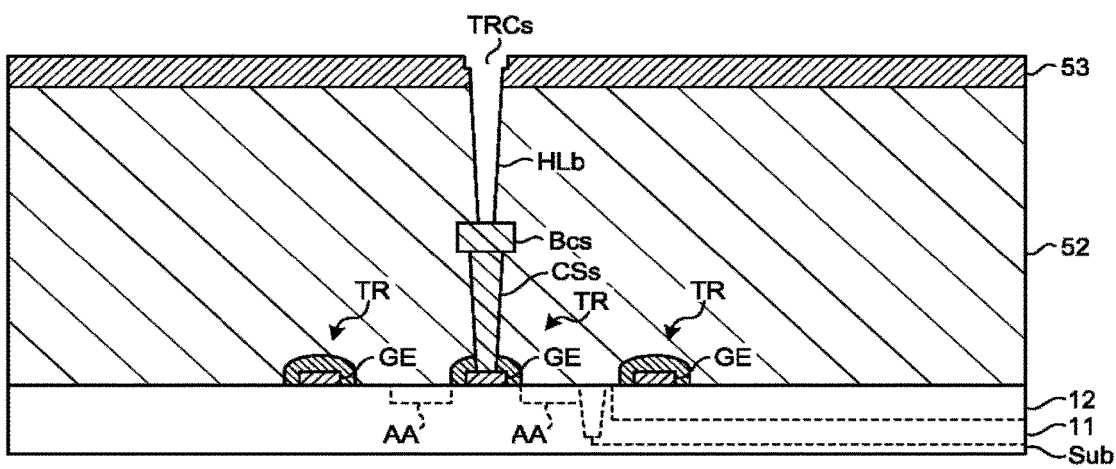

As illustrated in FIG. 16C, a contact hole HLb, which passes through the insulating layers 53 and 52 on the transistor TR and reaches the bonding portion Bcs at the upper end of contact CSs on the transistor TR, and a trench TRCs connected to an upper end of contact hole HLb are formed.

Figure 17A:
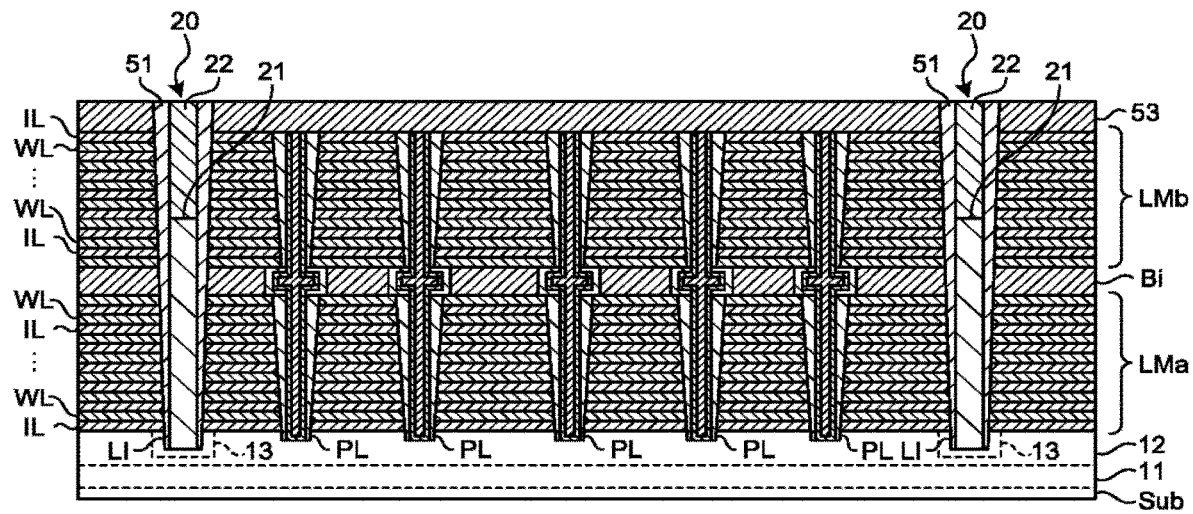
FIGS. 17A to 17C are flow diagrams illustrating examples of the procedure of the process of manufacturing the semiconductor storage device according to the embodiment.
Figure 17B:
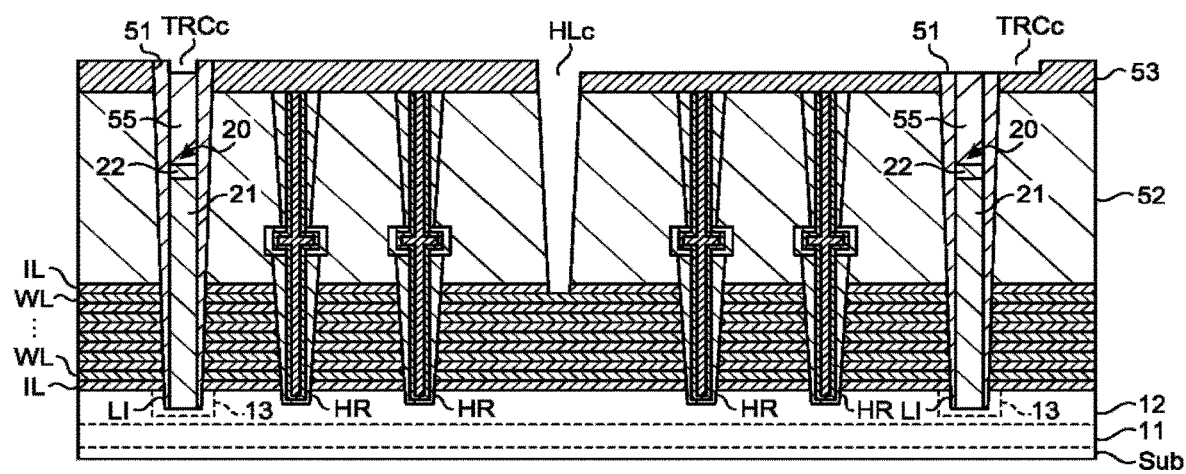
Figure 17C:
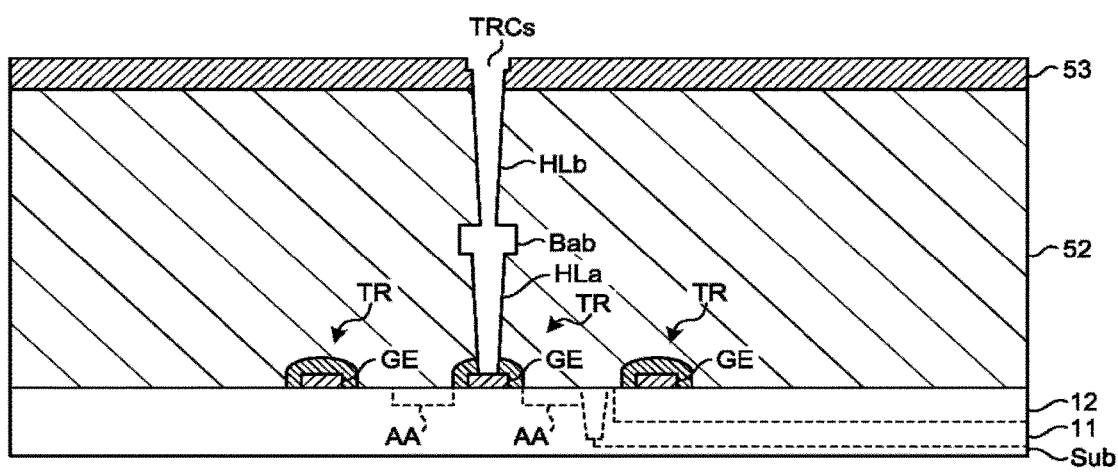

As illustrated in FIG. 17C, the sacrificial layer such as the amorphous silicon layer filling the bonding portion Bcs and the contact CSs is removed through the trench TRCs and the contact hole HLb so that a contact hole HLa reaching the gate electrode GE and a gap Bab disposed between the contact holes HLa and HLb are formed.

Figure 18A:
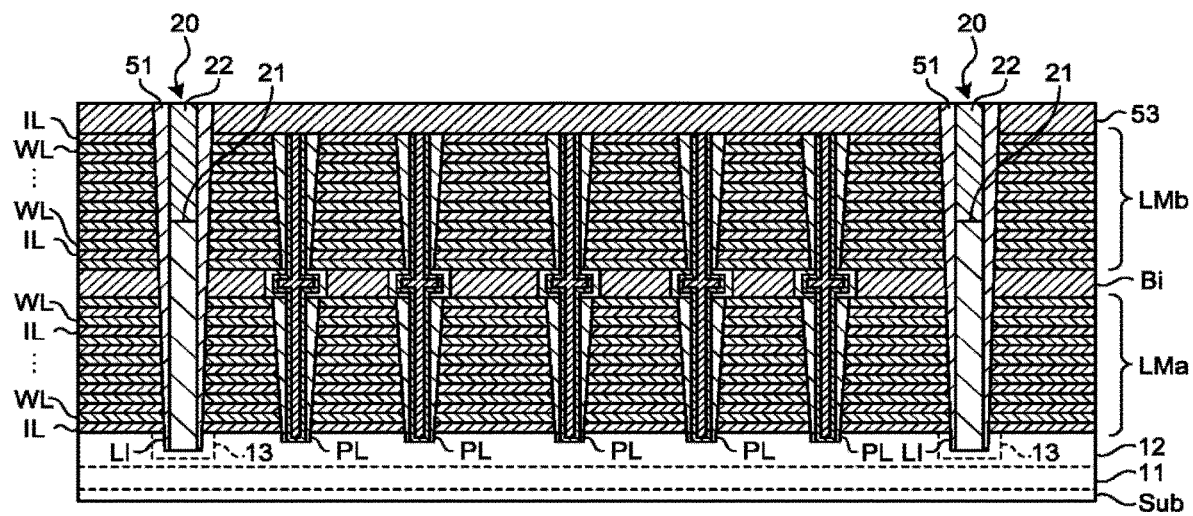
FIGS. 18A to 18C are flow diagrams illustrating examples of the procedure of the process of manufacturing the semiconductor storage device according to the embodiment.
Figure 18B:
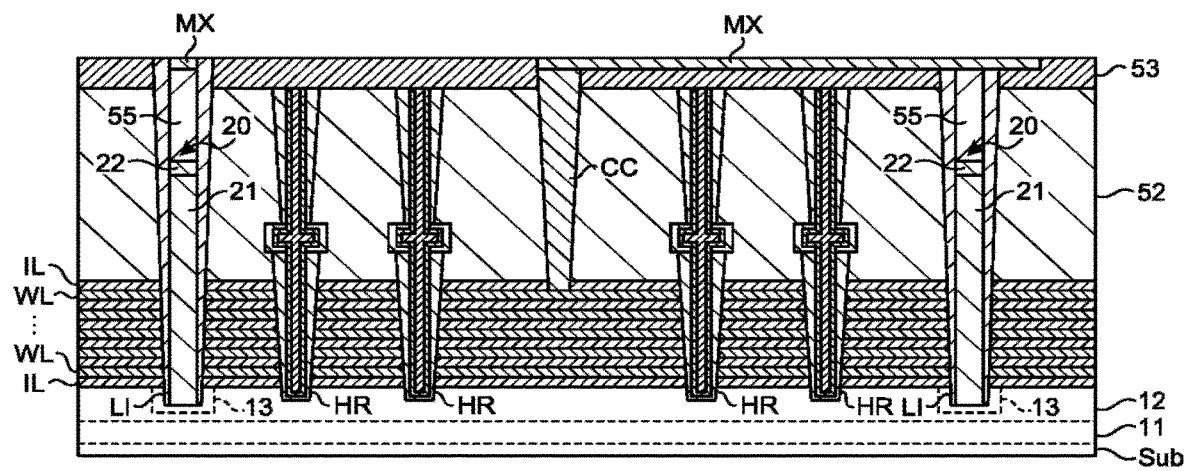

As illustrated in FIG. 18B, the contact hole HLc and the trench TRCc are filled with a conductive material to form the contact CC and the wiring layer MX connected to the contact CC. The wiring layer MX is formed to be, for example, partially overlaps the conductive portion 20 of the contact LI.

Figure 18C:
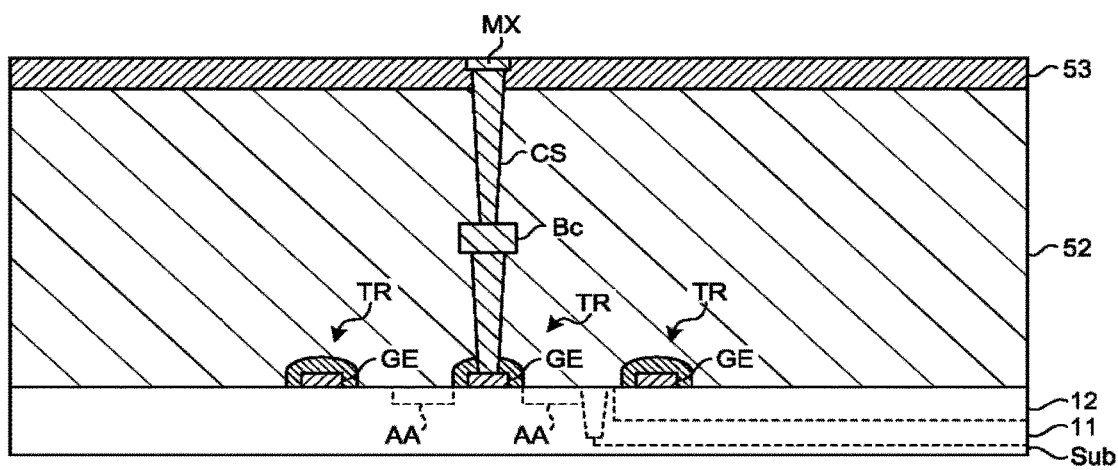

As illustrated in FIG. 18C, the contact holes HLa and HLb, the gap Bab between the contact holes HLa and HLb, and the trench TRCs are filled with a conductive material to form the contact CS having the bonding portion Bc and the wiring layer MX connected to the contact CS.

As described above, FIGS. 16A to 18C illustrate the example using the dual damascene method in which the contacts CC and CS and the wiring layers MX connected to the contacts CC and CS are collectively formed. However, a single damascene method or the like in which the contacts CC and CS and the wiring layer MX are separately formed may be used.

Figure 19A:
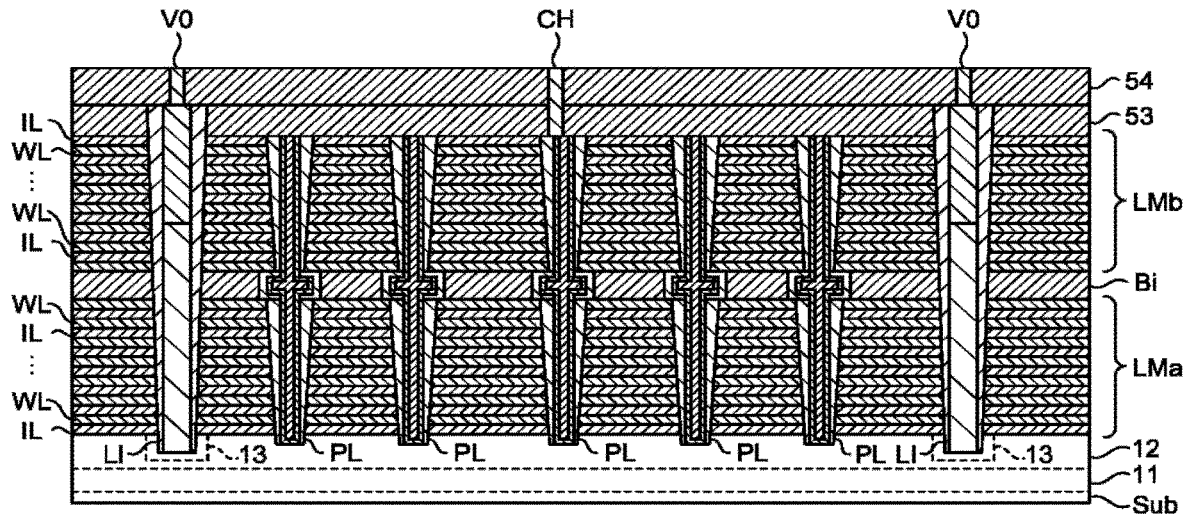
FIGS. 19A to 19C are flow diagrams illustrating examples of the procedure of the process of manufacturing the semiconductor storage device according to the embodiment.
Figure 19B:
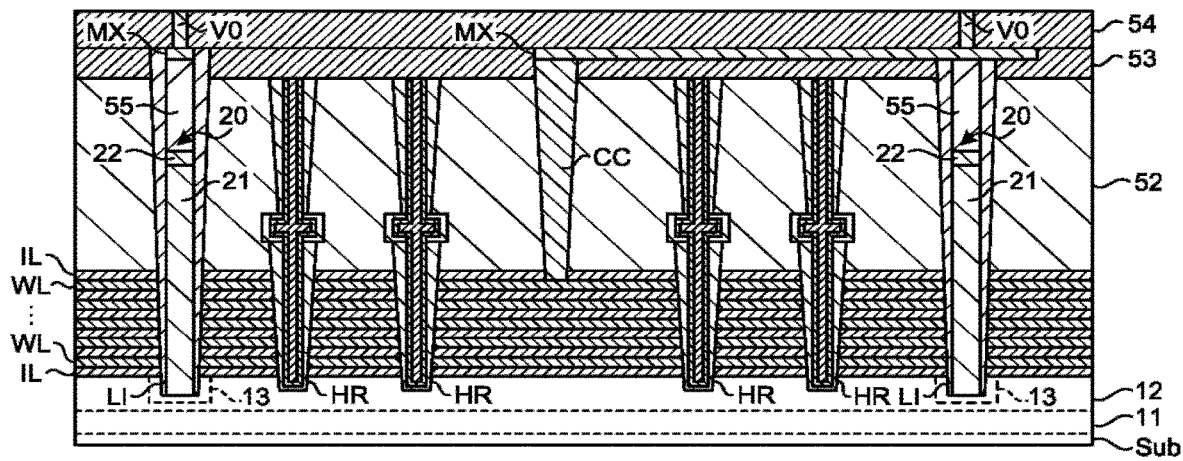
Figure 19C:
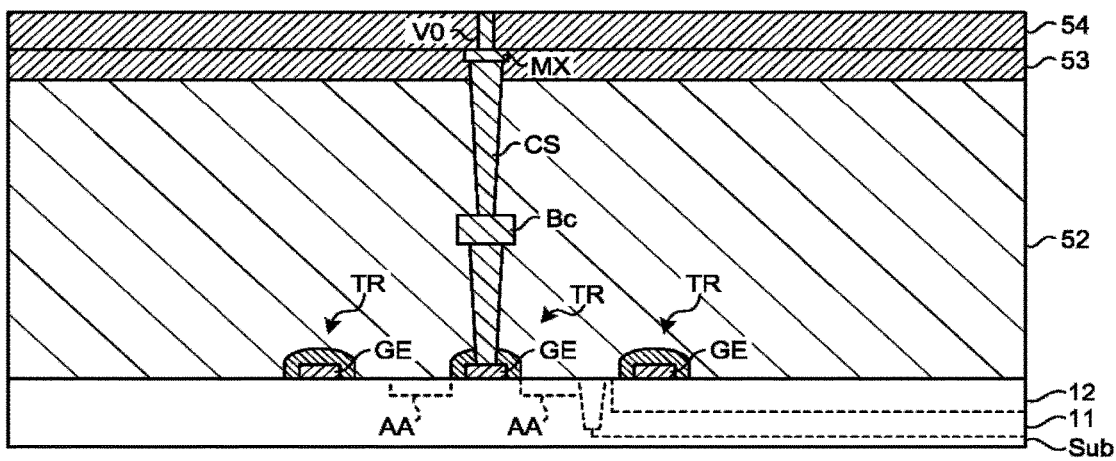

As illustrated in FIGS. 19A to 19C, the insulating layer 54 is formed at an upper layer of each portion. That is, the insulating layer 54 is formed on the insulating layer 53 in the site illustrated in FIG. 19A. In the sites illustrated in FIGS. 19B and 19C, the insulating layer 54 is formed on the insulating layer 53 so as to cover the wiring layer MX.

As illustrated in FIG. 19A, the plug CH, which passes through the insulating layers 53 and 54 and connects the channel layer CN of the pillar PL and the upper layer wiring (not illustrated) such as the bit line, is formed. The plug V0, which passes through the insulating layer 54 and connects the contact LI and the upper layer wiring (not illustrated), is formed.

As illustrated in FIGS. 18B and 18C, the plug V0, which passes through the insulating layer 54 and connects the wiring layer MX and the upper layer wiring (not illustrated), is formed.

Then, the process of manufacturing the semiconductor storage device 1 of the embodiment is ended.

In a semiconductor storage device in which memory cells have been three-dimensionally disposed and highly integrated, how to ensure a space to dispose various wirings becomes an issue. The present inventor has examined a method of disposing a wiring layer above a stepped portion where a word line of a stacked body is led out.

However, a contact functioning as the source line contact in the memory portion extends in the X direction until reaching to the stepped portion, and thus, it is difficult to ensure a sufficient withstand voltage between the contact and the wiring layer above the stepped portion. It is also conceivable to dispose the wiring layer on a more upper layer in order to ensure the withstand voltage. In such a case, the upper layer wiring or the like of the wiring layer is also disposed on a more upper layer.

Meanwhile, the channel layer at a lower position than the wiring layer is connected to the upper layer wiring, in the plug connected to the channel layer of the pillar. When the upper layer wiring is disposed at a high position, a connection distance between the channel layer and the upper layer wiring using the plug becomes longer, the degree of difficulty in forming the plug increases, and a wiring resistance of the plug increases in some cases.

According to the semiconductor storage device 1 of the embodiment, the conductive portion 20 inside the contact LI in the stepped portion STR is at a lower position than the conductive portion 20 inside the contact LI in the memory portion MEM. As a result, the conductive portion 20 allows the wiring layer MX to be overlapped above the contact LI in the stepped portion STR, and it becomes easy to ensure a space for disposing the wiring layer MX above the stepped portion STR.

According to the semiconductor storage device 1 of the embodiment, the conductive portion 20 in the stepped portion STR is disposed at the low position, and thus, it is possible to dispose the insulating layer 55 having the sufficient layer thickness on the conductive portion 20. As a result, the wiring layer MX can be disposed, for example, at the same height as the conductive portion 20 of the contact LI of the memory portion MEM while ensuring the withstand voltage between the conductive portion 20 and the wiring layer MX.

According to the semiconductor storage device 1 of the embodiment, it is not necessary to dispose the wiring layer MX and the upper layer wiring connected thereto at high positions. As a result, the connection distance of the plug CH connecting the channel layer CN of the pillar PL and the upper layer wiring may be short. Accordingly, the process of forming the plug CH becomes easy. In addition, it is possible to suppress the increase in the wiring resistance of the plug CH.

Incidentally, the semiconductor storage device 1 includes the stacked bodies LMa and LMb configured in two tiers in the above-described embodiment, but the embodiment is not limited thereto. The semiconductor storage device may have only one tier of a stacked body, or may have three or more tiers of stacked bodies.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a stacked body in which a plurality of conductive layers are stacked with an insulating layer interposed therebetween, the stacked body having a memory portion in which a plurality of memory cells are disposed and a stepped portion in which ends of the plurality of conductive layers form a step shape;
   a plurality of pillars which are disposed in the memory portion, extend in a stacking direction of the stacked body, and form the plurality of memory cells at intersections with at least some conductive layers among the plurality of conductive layers; and
   a conductive portion which extends in the memory portion in the stacking direction of the stacked body inside the plurality of conductive layers from an uppermost conductive layer among the plurality of conductive layers, extends in the stepped portion in the stacking direction of the stacked body inside at least some layers among the plurality of conductive layers, and extends from the memory portion to the stepped portion in a direction intersecting the stacking direction of the stacked body,
   wherein a height of the conductive portion in the stepped portion is lower than a height of the conductive portion in the memory portion.

2. The semiconductor storage device according to claim 1, further comprising
   a wiring layer disposed above the stepped portion.

3. The semiconductor storage device according to claim 2, wherein
   a height of a lower surface of the wiring layer is equal to or lower than a height of an upper end of the conductive portion in the memory portion.

4. The semiconductor storage device according to claim 3, wherein
   the height of the lower surface of the wiring layer is higher than a height of an upper end of the conductive portion in the stepped portion.

5. The semiconductor storage device according to claim 2, wherein
   a height of an upper surface of the wiring layer is substantially equal to a height of an upper end of the conductive portion in the memory portion.

6. The semiconductor storage device according to claim 5, further comprising
   a plug connecting an upper end of the pillar to a bit line, wherein a height of a lower end of the plug is lower than a height of a lower surface of the wiring layer, and a height of an upper end of the plug is higher than the height of the upper surface of the wiring layer.

7. The semiconductor storage device according to claim 1, wherein
   the conductive portion is constituted by a lower conductive layer and an upper conductive layer containing a different material from the lower conductive layer,
   a thickness of the lower conductive layer is substantially equal in the memory portion and the stepped portion, and a thickness of the upper conductive layer in the stepped portion is thinner than a thickness of the upper conductive layer in the memory portion.

8. The semiconductor storage device according to claim 2, further comprising
   a peripheral circuit which is disposed in a periphery of the stacked body and contributes to an operation of the memory cells,
   wherein the wiring layer is electrically connected to the peripheral circuit.

9. The semiconductor storage device according to claim 2, further comprising
   a contact which is disposed in the stepped portion and leads out each of the conductive layers included in the stacked body,
   wherein the wiring layer is connected to the contact.

10. The semiconductor storage device according to claim 1, wherein
    the conductive portion in the memory portion is a source line contact.

11. A semiconductor storage device comprising:
    a stacked body in which a plurality of conductive layers are stacked with an insulating layer interposed therebetween, the stacked body having a memory portion in which a plurality of memory cells are disposed and a stepped portion in which ends of the plurality of conductive layers form a step shape;
    a plurality of pillars which are disposed in the memory portion, extend in a stacking direction of the stacked body, and form the plurality of memory cells at intersections with at least some conductive layers among the plurality of conductive layers;

a conductive portion which extends in the memory portion in the stacking direction of the stacked body inside the plurality of conductive layers from an uppermost conductive layer among the plurality of conductive layers, extends in the stepped portion in the stacking direction of the stacked body inside at least some layers among the plurality of conductive layers, and extends from the memory portion to the stepped portion in a direction intersecting the stacking direction of the stacked body; and a wiring layer which is disposed above the stepped portion to have a height substantially equal to a height of an upper end of the conductive portion in the memory portion.

12. The semiconductor storage device according to claim 11, wherein
a height of the conductive portion in the stepped portion is lower than a height of the conductive portion in the memory portion.

13. The semiconductor storage device according to claim 11, wherein
the wiring layer partially overlaps the conductive portion in the stepped portion in a top view.

14. The semiconductor storage device according to claim 12, wherein
a height of a lower surface of the wiring layer is equal to or lower than the height of the upper end of the conductive portion in the memory portion.

15. The semiconductor storage device according to claim 14, wherein
the height of the lower surface of the wiring layer is higher than a height of an upper end of the conductive portion in the stepped portion.

16. The semiconductor storage device according to claim 12, wherein
a height of an upper surface of the wiring layer is substantially equal to the height of the upper end of the conductive portion in the memory portion.

17. The semiconductor storage device according to claim 16, further comprising
a plug connecting an upper end of the pillar to a bit line, wherein a height of a lower end of the plug is lower than a height of a lower surface of the wiring layer, and a height of an upper end of the plug is higher than the height of the upper surface of the wiring layer.

18. The semiconductor storage device according to claim 11, further comprising
a peripheral circuit which is disposed in a periphery of the stacked body and contributes to an operation of the memory cells,
wherein the wiring layer is electrically connected to the peripheral circuit.

19. The semiconductor storage device according to claim 11, further comprising
a contact which is disposed in the stepped portion and leads out each of the conductive layers included in the stacked body,
wherein the wiring layer is connected to the contact.

20. The semiconductor storage device according to claim 11, wherein
the conductive portion in the memory portion is a source line contact.

* * * * *